(12) United States Patent
Park et al.

(10) Patent No.: US 11,515,369 B2
(45) Date of Patent: Nov. 29, 2022

(54) DISPLAY DEVICE

(71) Applicant: SAMSUNG DISPLAY CO., LTD., Yongin-si (KR)

(72) Inventors: Young Woo Park, Yongin-si (KR); Tae Hyun Kim, Seoul (KR); Jong Hyun Choi, Seoul (KR); Hoon Gi Lee, Suwon-si (KR)

(73) Assignee: Samsung Display Co., LTD., Yongin-si (KR)

( * ) Notice: Subject to any disclaimer, the term of this patent is extended or adjusted under 35 U.S.C. 154(b) by 0 days.

(21) Appl. No.: 17/347,378

(22) Filed: Jun. 14, 2021

(65) Prior Publication Data

US 2022/0028935 A1 Jan. 27, 2022

(30) Foreign Application Priority Data

Jul. 22, 2020 (KR) .................. 10-2020-0090844

(51) Int. Cl.
*H01L 27/32* (2006.01)
*G06F 3/041* (2006.01)
*G06F 3/044* (2006.01)
*H01L 51/52* (2006.01)

(52) U.S. Cl.
CPC .......... *H01L 27/323* (2013.01); *G06F 3/0412* (2013.01); *G06F 3/0445* (2019.05); *H01L 27/3246* (2013.01); *H01L 27/3276* (2013.01); *H01L 51/5284* (2013.01); *H01L 51/5293* (2013.01)

(58) Field of Classification Search
CPC .... G06F 3/0445; G06F 3/0443; G06F 3/0412; G06F 3/04164; G06F 3/0446; G06F 2203/04112; G06F 2203/04103; G06F 2203/04102; G06F 2203/04111; H01L 51/5284; H01L 27/3246; H01L 27/3276; H01L 51/5293; H01L 27/323
See application file for complete search history.

(56) References Cited

U.S. PATENT DOCUMENTS

| 10,720,606 | B2 | 7/2020 | Song et al. |
| 2011/0050625 | A1 | 3/2011 | Kim et al. |
| 2021/0167163 | A1* | 6/2021 | Jeong .................. H01L 27/3272 |

FOREIGN PATENT DOCUMENTS

KR 10-2018-0075773 7/2018

* cited by examiner

*Primary Examiner* — Deeprose Subedi
(74) *Attorney, Agent, or Firm* — H.C. Park & Associates, PLC

(57) ABSTRACT

A display device includes a substrate having an active area, a visible region located on the active area, and a non-visible region farther from the active area in a first direction than the visible region is; a first conductive layer disposed on the substrate; a first insulating layer disposed on the first conductive layer; a second conductive layer disposed on the first insulating layer; a first via layer disposed on the second conductive layer; a second insulating layer disposed on the first via layer; and a third conductive layer disposed on the second insulating layer and including touch signal lines. The visible region includes a line area where the second conductive layer is disposed, and a line-free area where the second conductive layer is not disposed. The third conductive layer includes a dummy pattern disposed in the line-free area and has a width greater than the touch signal lines.

22 Claims, 30 Drawing Sheets

DISPLAY DEVICE

CROSS-REFERENCE TO RELATED APPLICATION

This application claims priority from and the benefit of Korean Patent Application No. 10-2020-0090844 filed on Jul. 22, 2020, which is hereby incorporated by reference for all purposes as if fully set forth herein.

BACKGROUND

Field

Embodiments described hereinbelow relate generally to a display device, and more particularly, to a display device including a touch member.

Discussion of the Background

Electronic devices that provide images to a user such as a smart phone, a tablet PC, a digital camera, a laptop computer, a navigation device and a smart TV include a display device for displaying images. Such a display device includes a display panel for generating and displaying images and various input mechanisms.

A display device includes an active area where images are displayed and a non-active area where no image is displayed. Recently, the non-active area tends to be reduced in size to accommodate a larger active area, or due to a display device being smaller in size than previous display devices. As the non-active area is reduced is reduced in size, lengths of various signal lines disposed in the non-active area may be reduced or design of the signal lines may be changed.

In particular, as the design of the signal lines is changed, in a visible region of the non-active area that is recognized by a user's eyes, there may be difference in visual sensation between an area where signal lines are disposed and an area where no signal line is disposed.

The above information disclosed in this Background section is only for understanding of the background of the inventive concepts, and, therefore, it may contain information that does not constitute prior art.

SUMMARY

Devices constructed/methods according to implementations/embodiments of the invention are capable of enabling display devices, such as smart phones, tablet computers or the like, to display images in a display area that is of a relatively small size, in which the devices also have a non-display area in which images are not displayed, to reduce a difference in a visual sensation of an image in a portion of a display area where signal lines are disposed as compared to an image in a portion of the display area where no signal lines are disposed.

To accomplish this, according to at least one embodiment, first, second and third touch pads are provided in the non-display area, with the first, second and third touch pads configured to receive first, second and third supply voltage signal lines, respectively, for supplying voltage to pixels disposed within the display area. By such an arrangement, a supply voltage can be reliably supplied to each pixel in the display area even if one of the supply voltage signal lines is disconnected.

Further, dummy patterns are disposed in line-free areas between left and right voltage signal lines provided in a non-display area of the display device. The dummy patterns are located on the same layer or at least above the source-drain conductive layer. Accordingly, by use of the dummy patterns, a difference in visual sensation of a black color between the area where the signal lines of the source-drain conductive layers and the touch conductive layers are disposed and the line-free areas in the visible region is prevented or minimized.

Aspects to be described in more detail hereinbelow provide a display device that can reduce a difference in visual sensation between an area where signal lines are disposed and an area where no signal line is disposed.

It should be noted that the aspects described hereinbelow are not limited to the above-mentioned aspects; and other aspects will be apparent to those skilled in the art from the following descriptions.

According to an aspect of the invention, a display device includes: a substrate having a visible region with an active area and a non-active area located on one side of the active area in a first direction, and a non-visible region defined thereon, wherein the non-visible region is farther from the active area in the first direction than the non-active area is; a first conductive layer disposed on the substrate; a first insulating layer disposed on the first conductive layer; a second conductive layer disposed on the first insulating layer; a first via layer disposed on the second conductive layer; a second insulating layer disposed on the first via layer; and a third conductive layer disposed on the second insulating layer and including a plurality of touch signal lines, wherein the non-active area of the visible region includes a line area where the second conductive layer is disposed, and a line-free area where the second conductive layer is not disposed, and wherein the third conductive layer includes a first dummy pattern that is disposed in the line-free area and has a width greater than that of the touch signal lines.

According to another aspect of the invention, a display device includes: a substrate having an active area and a non-active area on one side of the active area in a first direction defined thereon; a first conductive layer disposed on the substrate; a first insulating layer disposed on the first conductive layer; a second conductive layer disposed on the first insulating layer; a first via layer disposed on the second conductive layer; a second insulating layer disposed on the first via layer; a third conductive layer disposed on the second insulating layer and including a plurality of touch signal lines; and a protective layer disposed on the third conductive layer and having a black matrix disposed on a surface thereof that faces the substrate, wherein an end of the black matrix is spaced apart from the active area when viewed from above the display device, wherein the non-active area includes an non-visible region in which the black matrix is disposed entirely, and a visible region in which the black matrix is disposed partially, wherein the visible region includes an area where the second conductive layer is disposed, and a line-free area where the second conductive layer is not disposed, and wherein the third conductive layer includes a dummy pattern that is disposed in the line-free area and has a width larger than a width of the touch signal lines.

A display device may reduce difference in visual sensation between an area where signal lines are disposed and an area where no signal line is disposed.

The non-active area may include a bending region spaced apart from the active area, in which a boundary between the visible region and the non-visible region may be located between the bending region and the active area.

The second conductive layer may include a first signal line that is extended from the non-visible region to the visible region and bent in a second direction crossing the first direction.

The line-free area may include a first line-free area defined by an edge of the first signal line, the non-visible region and a boundary line of the visible region when viewed from above the display device, in which the first dummy pattern may be disposed in the first line-free area.

The first signal line may include a low-level supply voltage signal line.

The first dummy pattern may overlap a boundary between the non-visible region and the visible region in a thickness direction.

The first dummy pattern may overlap with an end of the first signal line in the thickness direction.

The first dummy pattern may be electrically connected to the first signal line.

The plurality of touch signal lines may overlap with the first signal line, and a separation distance between the first dummy pattern and an adjacent one of the touch signal lines may be equal to or greater than a separation distance between the touch signal lines adjacent to each other.

The touch signal lines may be extended such that they overlap the first signal line, and wherein the first dummy pattern is electrically connected to the touch signal lines.

The plurality of touch signal lines and the first signal line may be extended from a pad area on an end of the substrate, the pad area may include touch pads connected to the plurality of touch signal lines, a first signal line pad connected to the first signal line, and a dummy pattern pad may be connected to the first dummy pattern, and the first dummy pattern may be connected to the first dummy pattern pad through a dummy pattern line connected to the dummy pattern pad.

The display device may further include a bank layer disposed on the first via layer, in which at least one of the first via layer and the bank layer may further include a black-based colorant.

The second conductive layer may further include a second signal line spaced apart from the first signal line, and in which the line-free area may further include a second line-free area defined by an edge of the first signal line, an edge of the second signal line and the boundary line.

The third conductive layer may further include a second dummy pattern disposed in the second line-free area, in which the second dummy pattern may overlap the boundary line.

The second dummy pattern may be electrically connected to the second signal line.

The second signal line may include a high-level supply voltage signal line, in which the high-level supply voltage signal line may include a first-side high-level supply voltage signal line and a second-side high-level supply voltage signal line that are extended in a first direction and spaced apart from each other in a second direction, and may include a connection high-level supply voltage signal line that connects the first-side high-level supply voltage signal line with the second-side high-level supply voltage signal line, and in which the line-free area may further include a third line-free area defined by an edge of the first-side high-level supply voltage signal line, an edge of the second-side high-level supply voltage signal line, an edge of the connection high-level supply voltage signal line, and the boundary line.

The third conductive layer may further include a third dummy pattern disposed in the third line-free area, in which the third dummy pattern overlaps the boundary line.

According to another aspect of the invention, a display device includes: a substrate having an active area, a visible region located on the active area, and a non-visible region defined thereon; a plurality of conductive layers disposed on the substrate on top of each other in a layered manner; at least one insulating layer disposed between the plurality of conductive layers to thereby separate the plurality of conductive layers from being in electrical contact with each other, wherein the visible region includes a line area where one of the conductive layers beneath the topmost conductive layer is disposed, and a line-free area where the one of the conductive layers beneath the topmost conductive layer is not disposed, and wherein a topmost one of the plurality of conductive layers includes a first dummy pattern that is disposed in the line-free area.

The topmost conductive layer may include a plurality of touch signal lines provided therein, and the first dummy pattern has a width greater than a width of the touch signal lines.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
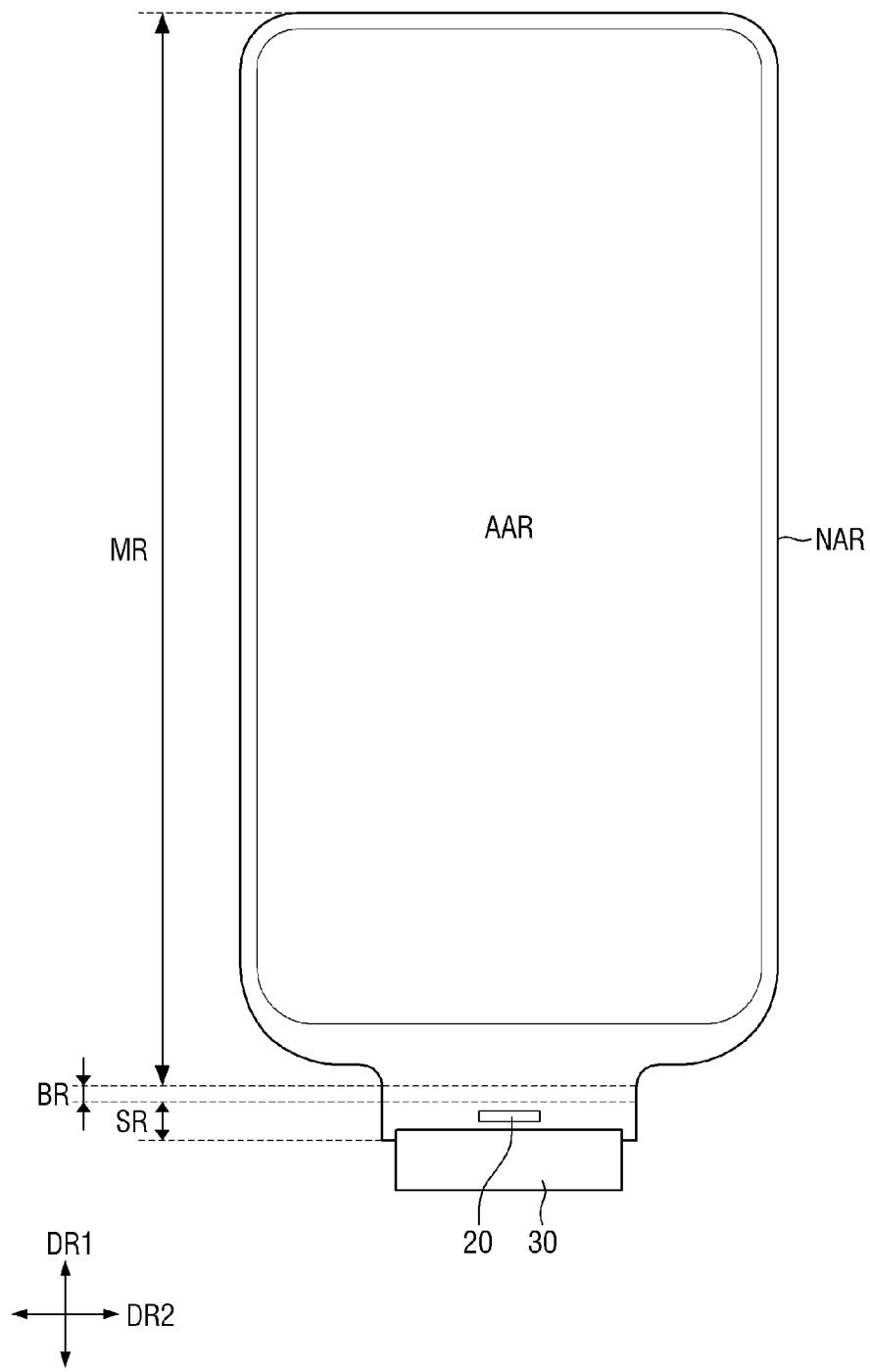
FIG. 1 is a plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the explanatory term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In embodiments, display devices, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, XXXXX, and/or one or more components thereof may include or otherwise be associated with one or more memories (not shown) including code (e.g., instructions) configured to cause XXXXX, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings.

Figure 2:
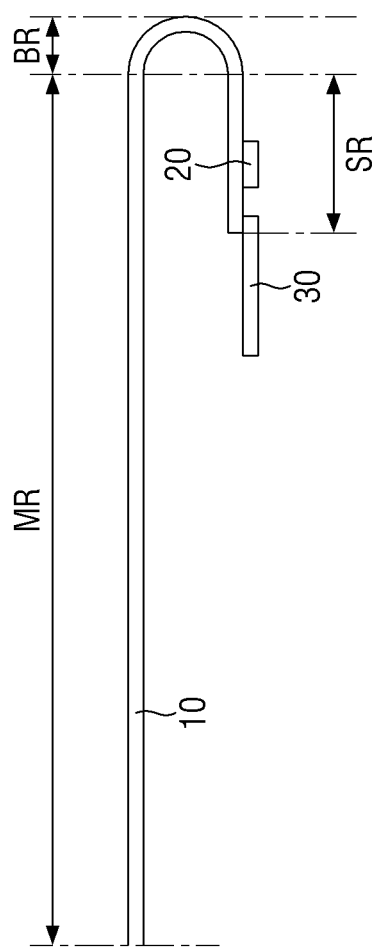
FIG. 2 is a cross-sectional view of a part of a display device according to an embodiment.

FIG. 1 is a plan view of a display device according to an embodiment. FIG. 2 is a cross-sectional view of a part of a display device according to an embodiment.

In the embodiments described herein, the first direction D1 may intersect the second direction D2. In the plan view of FIG. 1, the first direction DR1 is defined as the vertical direction and the second direction DR2 is defined as the horizontal direction for convenience of illustration. In the following description, a first side of the first direction DR1 indicates the upper side, a second side of the first direction DR1 indicates the lower side, a first side of the second direction DR2 indicates the right side, and a second side of the second direction DR2 indicates the left side when viewed from the top. It should be understood that the directions referred with respect to the embodiments described herein are relative directions, and the embodiments described herein are not limited to the directions mentioned.

Referring to FIGS. 1 and 2, a display device 1 may refer to any electronic device providing a display screen. The display device 1 may include portable electronic devices for providing a display screen, such as a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, an Internet of Things (JOT) device, etc.

The display device 1 includes an active area AAR and a non-active area NAR. In the display device 1, a display area may be defined as the area where images are displayed, a non-display area may be defined as the area where no image is displayed, and a touch area may be defined as the area where a touch input is sensed. The display area and the touch area may be included in the active area AAR. The display area and the touch area may overlap each other. That is to say, in the active area AAR, images are displayed and a touch input is sensed as well.

The shape of the active area AAR may be a rectangle or a rectangle with rounded corners. In the example shown, the shape of the active area AAR is a rectangle that has rounded corners and has its sides in the first direction DR1 longer than its sides in the second direction DR2. It is, however, to be understood that the embodiments described herein are not limited thereto. The active area AAR may have various shapes such as a rectangular shape with its sides in the second direction DR2 longer than its sides in the first direction DR1, a square shape, other polygonal shapes, a circular shape, and an elliptical shape.

The non-active area NAR is disposed around the active area AAR. The non-active area NAR may be a bezel area or a dead space. The non-active area NAR may surround all sides (four sides in the drawings) of the active area AAR. It is, however, to be understood that the embodiments described herein are not limited thereto. For example, the non-active area NAR may not be disposed near the upper side of the active region AAR or near the left or right side thereof.

In the non-active area NAR, signal lines for applying signals to the active area AAR (display area or touch area) or driving circuits may be disposed. The non-active area NAR may include no display area. Further, the non-active area NAR may include no touch area. In another embodiment, the non-active area NAR may include a part of the touch area, and a sensor member such as a pressure sensor may be disposed in that part. In some embodiments, the active area AAR may be completely identical to the display area where images are displayed, while the non-active area NAR may be completely identical to the non-display area where no image is displayed.

The display device 1 includes a display panel 10 for providing a display screen. Examples of the display panel 10 may include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. In the following description, an organic light-emitting display panel is employed as an example of the display panel 10, but the embodiments described herein are not limited thereto. Any other display panel may be employed as long as the technical idea of embodiments described herein can be equally applied.

The display panel 10 may include a plurality of pixels. The plurality of pixels may be arranged in a matrix. The shape of each pixel may be, but is not limited to, a rectangle or a square when viewed from the top. Each pixel may have a diamond shape having sides inclined with respect to the first direction DR1. Each pixel may include an emission area. Each emission area may have the same shape as or a different shape from the shape of the pixels. For example, when the pixels have a rectangular shape, the shape of the emission region of each of the pixels may have various shapes such as a rectangle, a diamond, a hexagon, an octagon, and a circle. A detailed description of the pixels and the emission regions will be given later.

The display device 1 may further include a touch member for sensing a touch input. The touch member may be implemented as a panel or film separated from the display panel 10 to be attached on the display panel 10 or may be implemented in the form of a touch layer inside the display panel 10. Although the touch member is provided inside the display panel to be included in the display panel 10 in the following description, it is to be understood that the embodiments described herein are not limited thereto.

The display panel 10 may include a flexible substrate including a flexible polymer material such as polyimide. Accordingly, the display panel 10 may be curved, bent, folded, or rolled.

The display panel 10 may include a bending region BR. The display panel 10 may be divided into a main region MR located on one side of the bending region BR and a subsidiary region SR located on the other side of the bending region BR.

The display area of the display panel 10 is located in the main region MR. According to an embodiment, the edge portions of the display area in the main region MR, the entire bending region BR and the entire subsidiary region SR may be the non-display area. It is, however, to be understood that the embodiments described herein are not limited thereto. The bending region BR and/or the subsidiary region SR may also include the display area.

The main region MR may have a shape generally similar to the appearance of the display device 1 when viewed from the top. The main region MR may be a flat region located in one plane. It is, however, to be understood that the embodiments described herein are not limited thereto. At least one of the edges of the main region MR except for the edge (side) connected to the bending region BR may be bent to form a curved surface or may be bent at a right angle.

When at least one of the edges of the main region MR except for the edge (side) connected to the bending region BR is curved or bent, the display area may also be disposed at the edge. It is, however, to be understood that the embodiments described herein are not limited thereto. The curved or bent edge may be the non-display area that does not display image, or the display area and the non-display area may be disposed together.

The bending region BR is connected to one side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in an L-shape.

In the bending region BR, the display panel 10 may be bent downward in the thickness direction, i.e., in the direction away from the display surface with a curvature. Although the bending region BR may have a constant radius of curvature, the embodiments described herein are not limited thereto. It may have different radii of curvature for difference sections. As the display panel 10 is bent at the bending region BR, the surface of the display panel 10 may be reversed. Specifically, the surface of the display panel 10 facing upward may be bent such that it faces outward at the bending region BR and then faces downward.

The subsidiary region SR is extended from the bending region BR. The subsidiary region SR may be extended in a direction parallel to the main region MR after the display device has been bent. The subsidiary region SR may overlap with the main region MR in the thickness direction of the display panel 10. The width of the subsidiary region SR (the width in the second direction DR2) may be, but is not limited to being, equal to the width of the bending region BR.

A driver chip 20 may be disposed in the subsidiary region SR. The driver chip 20 may include an integrated circuit for driving the display panel 10. The integrated circuit may include an integrated circuit for a display. The integrated circuit for a display and the integrated circuit for a touch unit may be provided as separate chips or may be integrated into a single chip.

A driver board 30 may be connected to the end of the subsidiary region SR of the display panel 10. The driver board 30 may be a flexible printed circuit board or a flexible printed circuit film. Although not shown in the drawings, a driver chip including an integrated circuit for a touch unit and a control circuit may be disposed on the driver board 30. It is, however, to be understood that the embodiments described herein are not limited thereto. The driver chip 20 may include not only an integrated circuit for a display but also an integrated circuit for a touch unit.

Figure 3:
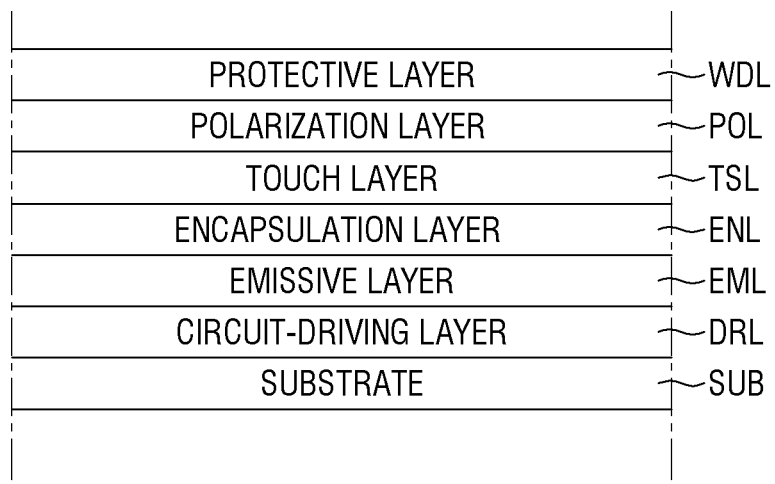
FIG. 3 is a cross-sectional view showing an example of a stack structure of a display panel according to an embodiment.

FIG. 3 is a cross-sectional view showing an example of a stack structure of a display panel according to an embodiment.

Referring to FIG. 3, the display panel 10 may include a circuit-driving layer DRL disposed on a substrate SUB. The circuit-driving layer DRL may include a circuit for driving an organic layer EML of a pixel. The circuit-driving layer DRL may include a plurality of thin-film transistors (TFTs).

The organic layer EML may be disposed on the circuit-driving layer DRL. The organic layer EML may include an organic emissive layer. The organic layer EML may emit light at different luminances depending on driving signals transmitted from the circuit-driving layer DRL.

An encapsulation layer ENL may be disposed on the organic layer EML. The encapsulation layer ENL may include an inorganic layer or a stack of an inorganic layer and an organic layer. As another example, glass or an encapsulation film may be employed as the encapsulation layer ENL.

A touch layer TSL may be disposed on the encapsulation layer ENL. The touch layer TSL may sense a touch input and may perform the functions of the touch member. The touch layer TSL may include a plurality of sensing regions and sensing electrodes.

A polarization layer POL may be disposed on the touch layer TSL. The polarization layer POL can reduce the reflection of external light. The polarization layer POL may be attached on the touch layer TSL by an adhesive layer. In some other implementations, the polarization layer POL may be eliminated. In an embodiment where the polarization layer POL is eliminated, a light-blocking pattern may be disposed on a non-emission area on the touch layer TSL, and a color filter may be disposed on an emission area. The light-blocking pattern may include the same material as a black matrix BM to be described later (see FIG. 18). The color filter may include a first color filter disposed in an emission area EMA_R of a first color pixel, a second color filter disposed in an emission area EMA_B of a second color pixel, and a third color filter disposed in an emission area EMA_G of a third color pixel (see FIG. 12). The light-blocking pattern may be disposed between adjacent color filters. Hereinafter, an example will be described where the polarization layer POL is disposed on the touch layer TSL.

A protective layer WDL may be disposed on the polarization layer POL. The protective layer WDL may include, for example, a window member. The protective layer WDL may be attached on the polarization layer POL by an optically clear adhesive or the like.

Figure 4:
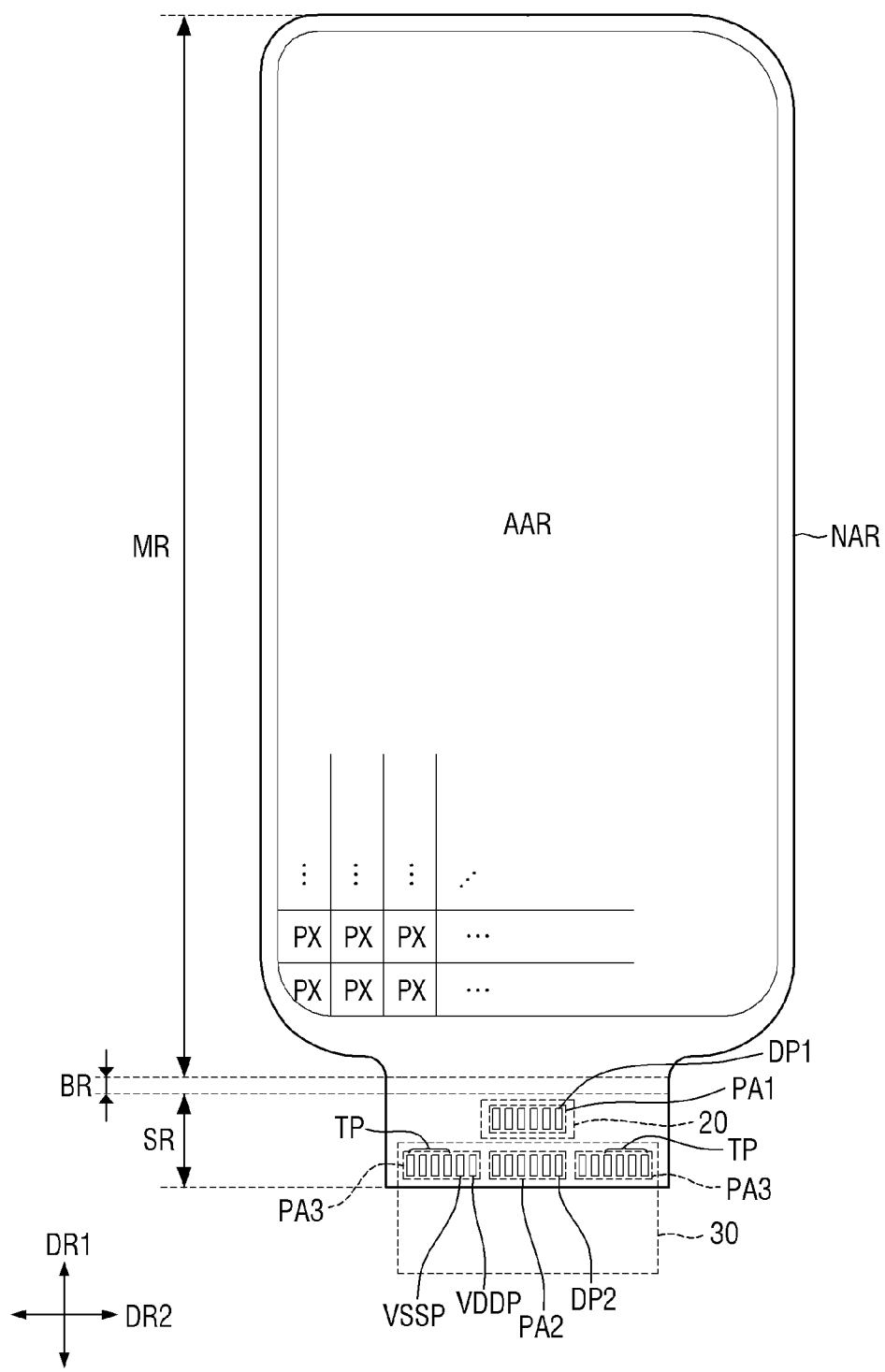
FIG. 4 is a plan view schematically showing a display panel according to an embodiment.

FIG. 4 is a plan view schematically showing a display panel according to an embodiment.

Referring to FIG. 4, the active area AAR may include a plurality of pixels PX. The plurality of pixels PX may be arranged in a matrix.

The subsidiary region SR may include a plurality of pad areas PA1, PA2 and PA3. The first pad area PA1 may be located closer to the bending region BR than the second and third pad areas PA2 and PA3. A plurality of first data pads DP1 connected to the driver chip 20 may be disposed in the first pad area PA1. The first data pads DP1 may be arranged along the second direction DR2.

The second and third pad areas PA2 and PA3 may be located closer to the end of the subsidiary region SR than the first pad area PA1. A plurality of pads DP2, TP, VSSP and VDDP connected to the driver chip 20 may be disposed in the second and third pad areas PA2 and PA3. A plurality of second data pads DP2 connected to the driver chip 20 may be disposed in the second pad area PA2. Although not shown in the drawings, a signal line connecting the second data pads DP2 with the first data pads DP1 may be further disposed between the second pad area PA2 and the first pad area PA1.

There may be two third pad areas PA3. The two third pad areas PA3 may be disposed with the second pad area PA2 interposed therebetween. The third pad areas PA3 may be located on one side and the other side of the second pad area PA2 in the second direction DR2, respectively. The third pad areas PA3 disposed on the one side and the other side of the second pad area PA2 in the second direction DR2 may be symmetrical with respect to the second pad area PA2. In the third pad area PA3 located on the other side of the second pad area PA2 in the second direction DR2, touch pads TP, a first supply voltage line pad VSSP, and a second supply voltage line pad VDDP may be disposed. The first supply voltage may have a value smaller than the second supply voltage. The first supply voltage may be a low voltage, while the second supply voltage may be a high voltage.

The touch pads TP, the first supply voltage line pad VSSP, and the second supply voltage line pad VDDP may be arranged along the second direction DR2. In the example shown in FIG. 4, four touch pads TP, one first supply voltage line pad VSSP and one second supply voltage line pad VDDP are disposed in the third pad area PA3 located on the other side of the second pad area PA2 in the second direction DR2. It is, however, to be understood that the numbers are not limited thereto.

Figure 5:
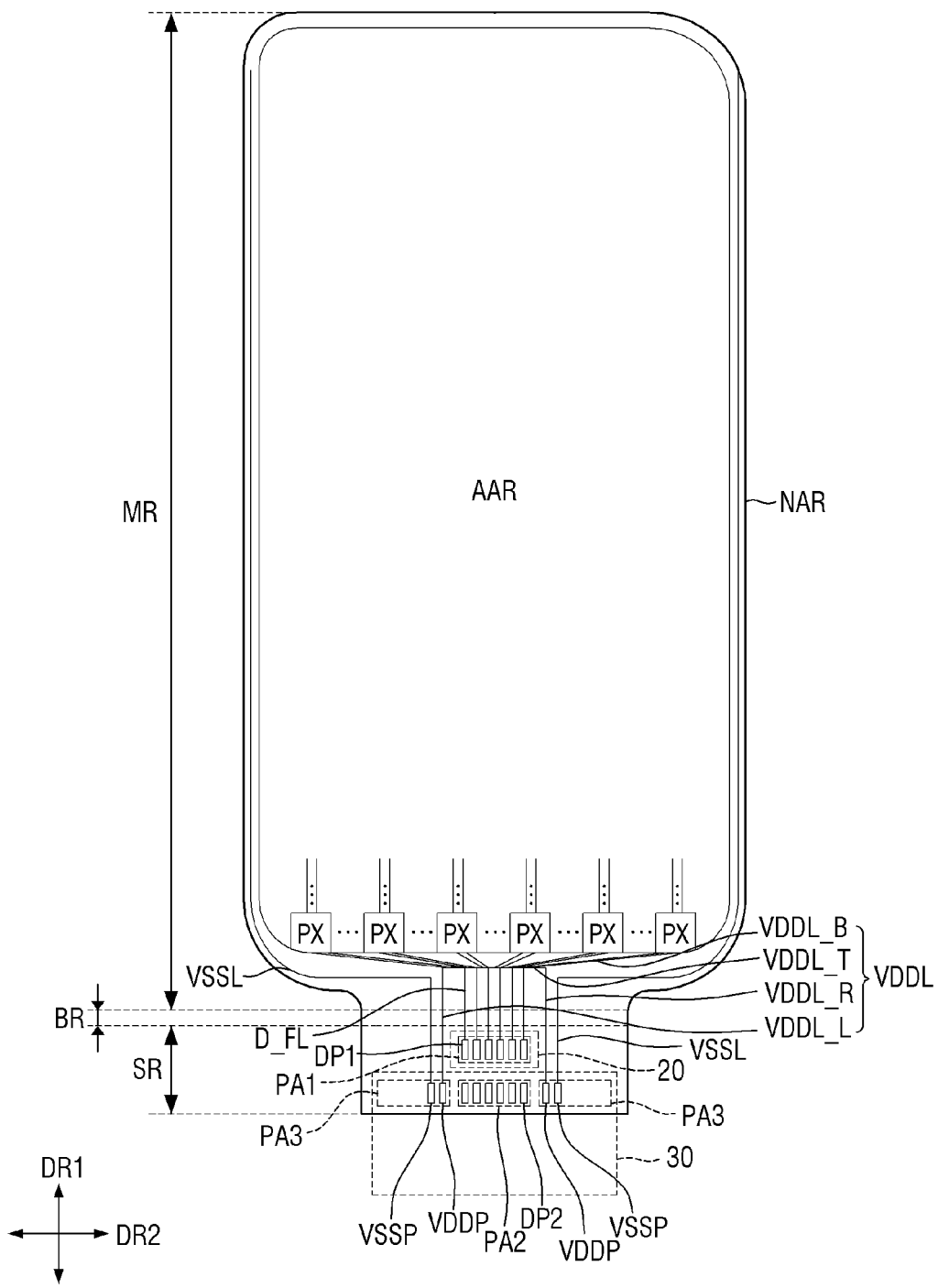
FIG. 5 is a plan view of showing the bottom of a touch member of a display panel according to an embodiment.

FIG. 5 is a plan view of showing the bottom of a touch member of a display panel according to an embodiment. As FIG. 5 shows the bottom of the touch member of the display panel, the touch pads TP described above with reference to FIG. 4 are not depicted. In FIG. 5, signal lines connected to the pads DP1, DP2, VSSP and VDDP, respectively, are further depicted.

Referring to FIG. 5, the first data pads DP1 may be connected to data fan-out lines D_FL, respectively. The data fan-out lines D_FL may be connected to data lines DL passing through pixel columns arranged along the first direction DR1, respectively.

The first supply voltage pad VSSP may be connected to the first supply voltage signal line VSSL. The first supply voltage signal line VSSL connected to the first supply voltage pad VSSP in the third pad area PA3 on the second side of the second direction DR2 may be extended from the first supply voltage pad VSSP toward first side of the first direction DR1, may be bent toward the second side of the second direction DR2 in the non-active area NAR on the lower side of the active area AAR, may be bent again toward the first side of the first direction DR1 in the non-active area NAR at the corner of the active area AAR between the second side of the first direction DR1 and the second side of the second direction DR2, and then may be terminated at the corner of the active area AAR between the first side of the first direction DR1 and the second side of the second direction DR2. The first supply voltage signal line VSSL connected to the first supply voltage pad VSSP in the third pad area PA3 on the first side of the second direction DR2 may be symmetrical in the second direction DR2 to the first supply voltage signal line VSSL connected to the first supply voltage pad VSSP in the third pad area PA3 on the second side of the second direction DR2.

In some other embodiments, the first supply voltage signal line VSSL connected to the first supply voltage pad VSSP in the third pad area PA3 on the first side of the second direction DR2 may be connected to the first supply voltage signal line VSSL connected to the first supply voltage pad VSSP in the pad area PA3 on the second side of the second direction DR2 in the non-active area NAR on the upper side of the active area AAR.

The second supply voltage pad VDDP in the third pad area PA3 on the second side of the second direction DR2 may be connected to the left second supply voltage signal line VDDL_L extended in the first direction DR1, and the second supply voltage pad VDDP in the third pad area PA3 on the first side of the second direction DR2 may be connected to the right second supply voltage signal line VDDL_R extended in the first direction DR1. According to an embodiment, as the second supply voltage signal line VDDL receives the second supply voltage through the left second supply voltage signal line VDDL_L and the right supply voltage signal line VDDL_R, the second supply voltage can be reliably applied even if one of the left second supply voltage signal line VDDL_L and the right supply voltage signal line VDDL_R is disconnected. The level of the second supply voltage applied through the left second supply voltage signal line VDDL_L may be equal to the level of the second supply voltage applied through the right second supply voltage signal line VDDL_R. However, there may be a slight difference in the level of the second supply voltage between the left second supply voltage applied and the right second supply voltage signal line VDDL_R. In this regard, it is possible to prevent an error in the applied second supply voltage by connecting the left second supply voltage signal line VDDL_L with the right second supply voltage signal line VDDL_R through a connection second supply voltage signal line VDDL_T extended in the second direction DR2. A plurality of branch second supply voltage signal lines VDDL_B may branch off from the connection second supply voltage signal line VDDL_T toward the active area AAR. The branch second supply voltage signal lines VDDL_B may pass through pixel columns arranged along the first direction DR1, respectively.

Figure 6:
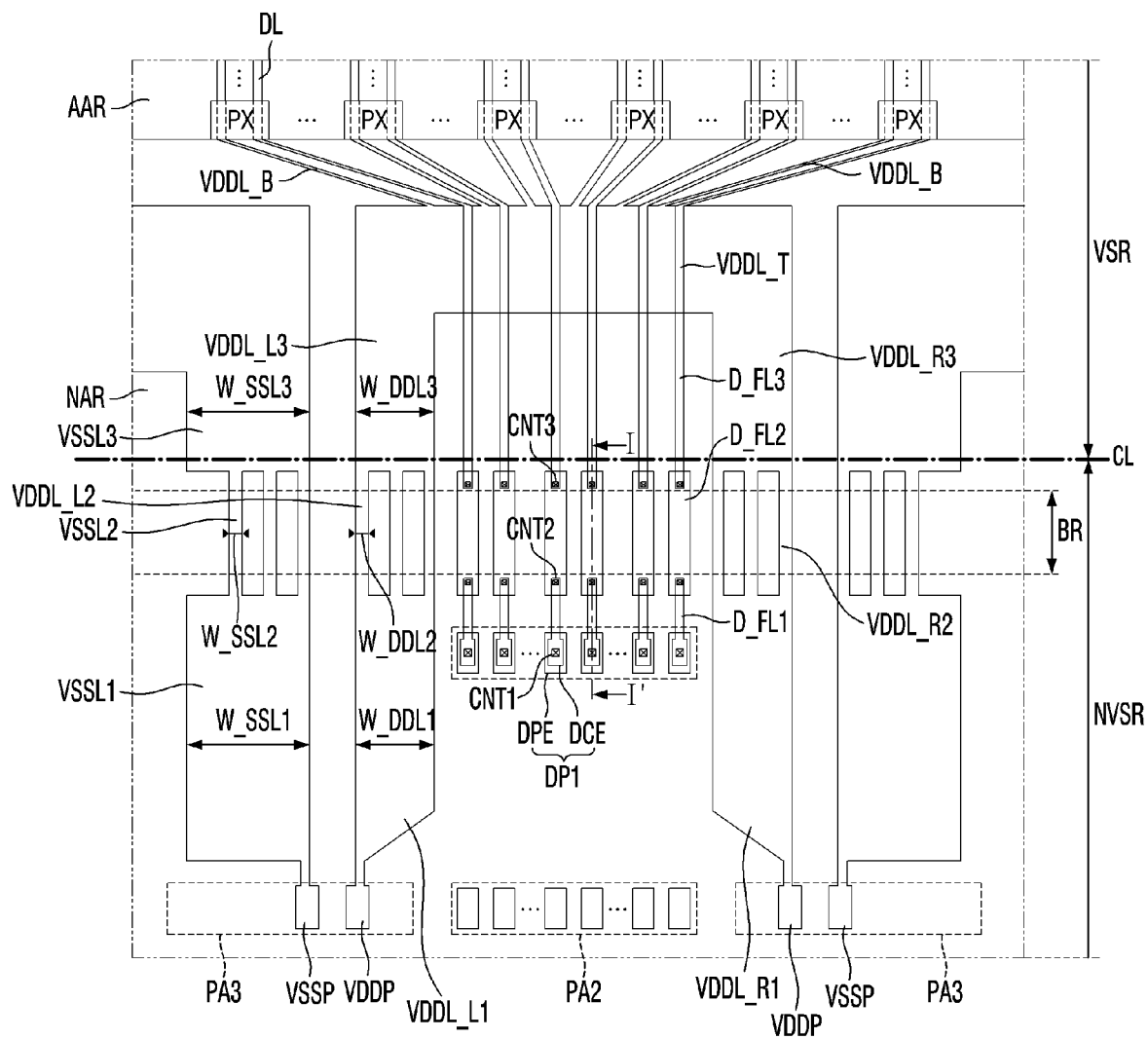
FIG. 6 is an enlarged plan view showing a part of the active area and the non-active area of FIG. 5.
Figure 7:
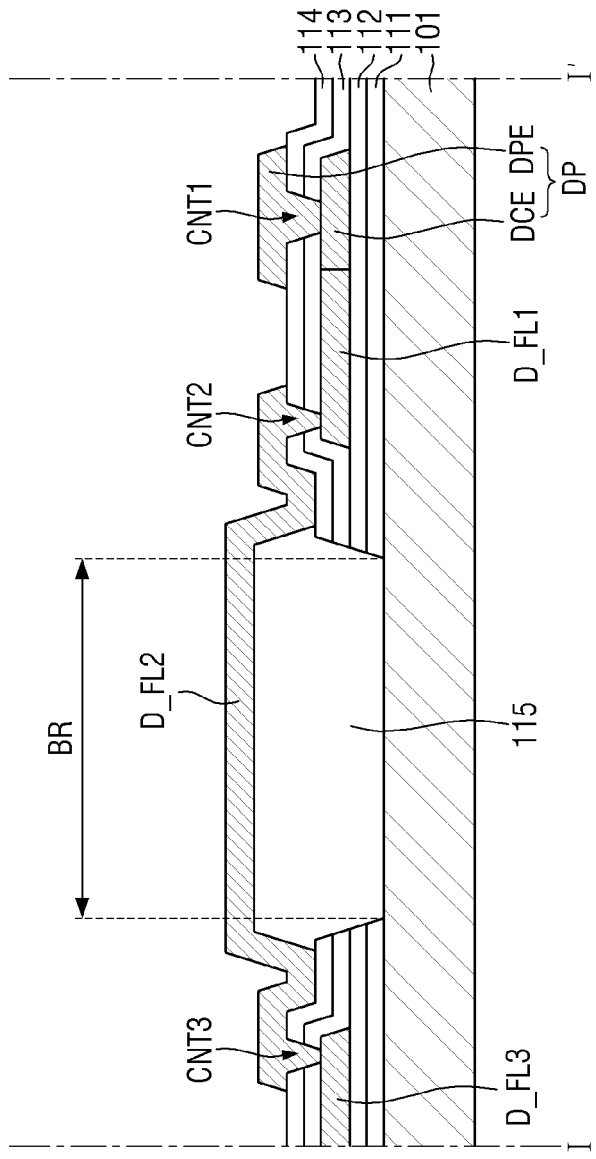
FIG. 7 is a cross-sectional view taken along line I-I' of FIG. 6.

FIG. 6 is an enlarged plan view showing a part of the active area and the non-active area of FIG. 5. FIG. 7 is a cross-sectional view taken along line I-I' of FIG. 6. Like reference numerals to those used in FIGS. 1 to 5 denote like elements, and redundant descriptions of such elements will not be repeated for sake of brevity.

Referring to FIGS. 6 and 7, a part of the non-active area NAR and the active area AAR may include a visible region VSR, and another part of the non-active area NAR may include a non-visible region NVSR. The visible region VSR and the non-visible region NVSR may be in contact with each other at the boundary line CL extended in the second direction DR2. The width of the non-visible region NVSR in the first direction DR1 may be greater than the width of the bending region BR in the first direction DR1.

Each of the first data pads DP1 in the first pad area PA1 may include a pad contact DCE and a pad electrode DPE on the pad contact DCE overlapping it in the thickness direction. The pad contact DCE may be connected to the pad electrode DPE on the pad contact DCE overlapping it in the thickness direction through a first contact hole CNT1. The pad contact part DCE is connected to the data fan-out line D_FL. The data fan-out line D_FL may include a first data fan-out line part D_FL1 physically connected to the pad contact DCE, a second data fan-out line part D_FL2 connected to the first data fan-out line part D_FL1, and a third data fan-out line part D_FL3 connecting the second data fan-out line part D_FL2 with the data line DL. The first data fan-out line part D_FL1 and the third data fan-out line part D_FL3 may be connected to the second data fan-out line part D_FL2 through contact holes CNT2 and CNT3 in the non-visible region NVSR adjacent to the bending region BR. The third data fan-out line part D_FL3 may be extended from the non-visible region NVSR to the visible region VSR and may be connected to the data line DL. The second data fan-out line part D_FL2 may be disposed in the bending region BR.

Figure 18:
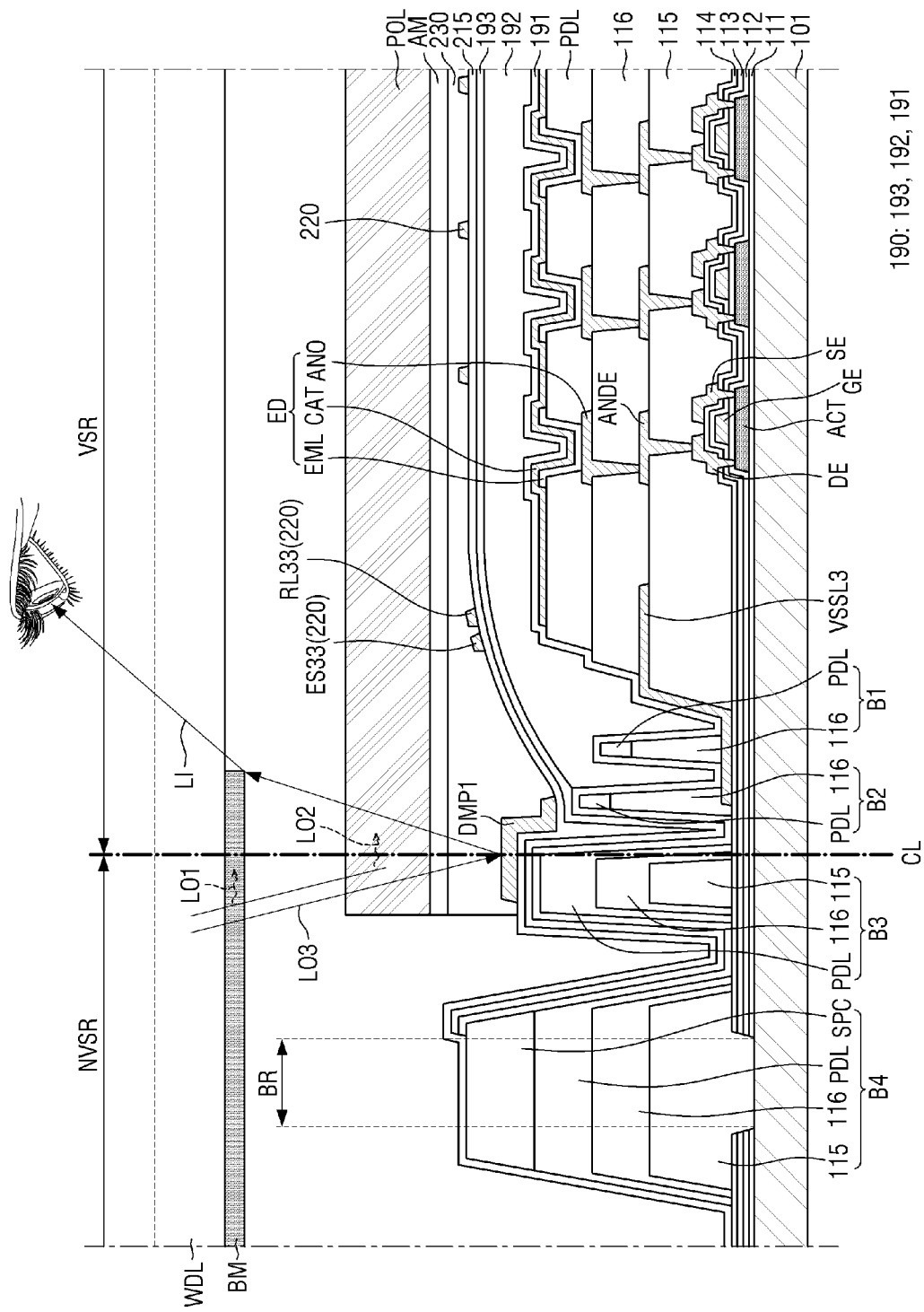
FIG. 18 is a cross-sectional view showing a visible region distinguished from a non-visible region according to an embodiment.

In the non-visible region NVSR, the elements under a black matrix BM are not seen by a user as the black matrix BM is disposed on the surface of a protect layer WDL that faces a substrate 101 (see FIG. 18). The visible region VSR refers to the other region of the display panel than the non-visible region NVSR, which is seen by the user.

As shown in FIG. 7, the second data fan-out line part D_FL2 may be located on a conductive layer different from the first data fan-out line part D_FL1 and the third data fan-out line part D_FL3. More specifically, the display panel may include a substrate 101, a buffer layer 111 on the substrate 101, a first gate insulating layer 112 on the buffer layer 111, a first gate conductive layer on the first gate insulating layer 112, a second gate insulating layer 113 on the first gate conductive layer, an interlayer dielectric layer 114 on the second gate insulating layer 113, a first via layer 115 on the interlayer dielectric layer, and a second source-drain conductive layer on the first via layer 115. The first gate conductive layer may include the first data fan-out line part D_FL1, the third data fan-out line part D_FL3, and the pad contact DCE. The second source-drain conductive layer may include a second data fan-out line part D_FL2. The pad contact DCE may be physically connected to the first data fan-out line part D_FL1, while the first data fan-out line part D_FL1 may be physically spaced apart from the third data fan-out line part D_FL3. The second data fan-out line part D_FL2 may be connected to the first data fan-out line part D_FL1 and the third data fan-out line part D_FL3 through contact holes CNT2 and CNT3 penetrating the second gate insulating layer 113 and the interlayer dielectric layer 114, respectively. The pad electrode DPE may be connected to the pad contact DCE through the contact hole CNT1 penetrating the second gate insulating layer 113 and the interlayer dielectric layer 114. The constituent material of the second source-drain conductive layer includes a material that is more flexible than the constituent material of the gate conductive layer, and the second data fan-out line part D_FL2 of the bending region BR is disposed on the second source-drain conductive layer, so that the bending stress of the data fan-out line D_FL can be reduced. As a result, it is possible to prevent the data fan-out line D_FL from being disconnected or from cracking.

The left second supply voltage signal line VDDL_L may be extended in the first direction DR1 from the second supply voltage pad VDDP on the second side of the second direction DR2, and the right second supply voltage signal line VDDL_R may be extended in the first direction DR1 from the second supply voltage pad VDDP on the first side of the second direction DR2. The second supply voltage signal lines VDDL_L and VDDL_R may include first to third supply voltage signal line parts VDDL_L1 to VDDL_L3 and VDDL_R1 to VDDL_R3, respectively. The second supply voltage signal lines VDDL_L and VDDL_R are symmetrical to each other in the second direction DR2 and have the same shape. Accordingly, only the left second supply voltage signal line VDDL_L will be described while the right second supply voltage signal line VDDL_R will not for sake of brevity.

The left second supply voltage signal line VDDL_L may include the first supply voltage signal line part VDDL_L1 physically connected to the second supply voltage pad VDDP, the second supply voltage signal line part VDDL_L2 connected to the first supply voltage signal line part VDDL_L1 and is disposed in the bending region BR, and the third supply voltage signal line part VDDL_L3 connected to the second supply voltage signal line part VDDL_L2. The first supply voltage signal line part VDDL_L1 may be extended in the first direction DR1 from the second supply voltage pad VDDP, terminated before the bending region BR, and branched into a plurality of second supply voltage line parts VDDL_L2. The plurality of second supply voltage signal line parts VDDL_L2 may be extended in the first direction DR1 and may be arranged in the second direction DR2. The width W_DDL2 of each of the second supply voltage signal line parts VDDL_L2 may be smaller than the width W_DDL1 of the first supply voltage signal line part VDDL_L1. Although three second supply voltage signal line parts VDDL_L2 are depicted in the example shown in FIG. 6, the number of second supply voltage signal line parts VDDL_L2 is not limited thereto. The length of the second supply voltage signal line part VDDL_L2 in the first direction DR1 may be larger than the length of the bending region BR in the first direction DR1. The second supply voltage signal line parts VDDL_L2 may pass through the bending region BR to be connected to the third supply voltage signal line part VDDL_L3. The width W_DDL3 of the third supply voltage signal line part VDDL_L3 may be greater than the width W_DDL2 of each of the second supply voltage line parts VDDL_L2. As the second supply voltage signal line parts VDDL_L2 disposed in the bending region BR are arranged in the second direction DR2 crossing the bending direction, and the width W_DDL2 thereof is designed to be smaller than that of the supply voltage signal line parts VDDL_1 and VDDL_L3 disposed in the non-bending regions, it is possible to reduce the bending stress applied to the left first supply voltage signal line VDDL_L. Furthermore, the width W_DDL3 of the third supply voltage signal line part VDDL_L3 may be equal to the width W_DDL1 of the first supply voltage signal line part VDDL_L1. The third supply voltage signal line part VDDL_L3 may be extended from the non-visible region NVSR to the visible region VSR.

The first supply voltage signal line part VDDL_L1, the second supply voltage signal line part VDDL_L2 and a part of the third supply voltage signal line part VDDL_L3 may be disposed in the non-visible region NVSR, and the other part of the third supply voltage signal line part VDDL_L3 may be disposed in the visible region VSR.

The third supply voltage signal line parts VDDL_L3 and VDDL_R3 of the second supply voltage signal lines VDDL_L and VDDL_R are respectively connected to the other end and one end of the connection second supply voltage signal line VDDL_T in the second direction DR2. The width of the connection second supply voltage signal line VDDL_T in the first direction DR1 may be greater than the width W_DDL3 of the third supply voltage signal line part VDDL_L3, but the embodiments described herein are not limited thereto. The width of the connection second supply voltage signal line VDDL_T in the first direction DR1 may be equal to or less than the width W_DDL3 of the third supply voltage signal line part VDDL_L3. A plurality of branch second supply voltage signal lines VDDL_B may branch off from the connection second supply voltage signal line VDDL_T toward the active area AAR.

The first supply voltage signal line VSSL may be extended in the first direction DR1 from the first supply voltage pad VDDP on the second side of the second direction DR2, and the first supply voltage signal line VSSL may be extended in the first direction DR1 from the first supply voltage pad VSSP on the first side of the second direction DR2. Each of the first supply voltage signal lines VSSL on the one side and the second side of the second direction DR2 may include first to third supply voltage signal line parts VSSL 1 to VSSL 3. The first supply voltage signal lines VSSL on the other side and the first side of the second direction DR2 are symmetrical to each other in the second direction DR2 and have the same shape. Accordingly, only the first supply voltage signal line VSSL on the second side of the second direction DR2 will be described while the first supply voltage signal line VSSL_R on the first side of the second direction DR2 will not.

The first second supply voltage signal line VSSL may include the first supply voltage signal line part VSSL1 physically connected to the first supply voltage pad VSSP, the first supply voltage signal line part VSSL2 connected to the first supply voltage signal line part VSSL1 and is disposed in the bending region BR, and the third supply voltage signal line part VSSL3 connected to the second supply voltage signal line part VSSL2. The first supply voltage signal line part VSSL1 may be extended in the first direction DR1 from the first supply voltage pad VSSP, terminated before the bending region BR, and branched into a plurality of second supply voltage line parts VSSL2. The plurality of second supply voltage signal line parts VSSL2 may be extended in the first direction DR1 and may be arranged in the second direction DR2. The width W_SSL2 of each of the second supply voltage signal line parts VSSL2 may be smaller than the width W_SSL1 of the first supply voltage signal line part VSSL1. Although three second supply voltage signal line parts VSSL2 are depicted in the example shown in FIG. 6, the number of second supply voltage signal line parts VSSL2 is not limited thereto. The length of the second supply voltage signal line part VDDL_L2 in the first direction DR1 may be larger than the length of the bending region BR in the first direction DR1. The second supply voltage signal line parts VSSL2 may pass through the bending region BR to be connected to the third supply voltage signal line part VSSL3. The width W_SSL3 of the third supply voltage signal line part VSSL3 may be greater than the width W_SSL2 of each of the second supply voltage line parts VSSL2.

As the second supply voltage signal line parts VSSL2 disposed in the bending region BR are arranged in the second direction DR2 crossing the bending direction, and the width W_SSL2 thereof is designed to be smaller than that of the supply voltage signal line parts VSSL1 and VSSL3 disposed in the non-bending regions, it is possible to reduce the bending stress applied to the left second supply voltage signal line VSSL2. Furthermore, the width W_SSL3 of the third supply voltage signal line part VSSL3 may be equal to the width W_SSL1 of the first supply voltage signal line part VSSL1. The third supply voltage signal line part VSSL3 may be extended from the non-visible region NVSR to the visible region VSR.

The second supply voltage line part VSSL2 may be connected to the sides of the adjacent supply voltage line parts VSSL1 and VSSL3 on the first side of the second direction DR2 but not to the sides of the supply voltage signal line parts VSSL1 and VSSL3 on the second side of the second direction DR2. Touch signal lines to be described later may pass on the sides of the supply voltage signal line parts VSSL1 and VSSL3 to which the second supply voltage signal line part VSSL2 is not connected on the second side of the second direction DR2.

Hereinafter, the touch member will be described in detail.

Figure 8:
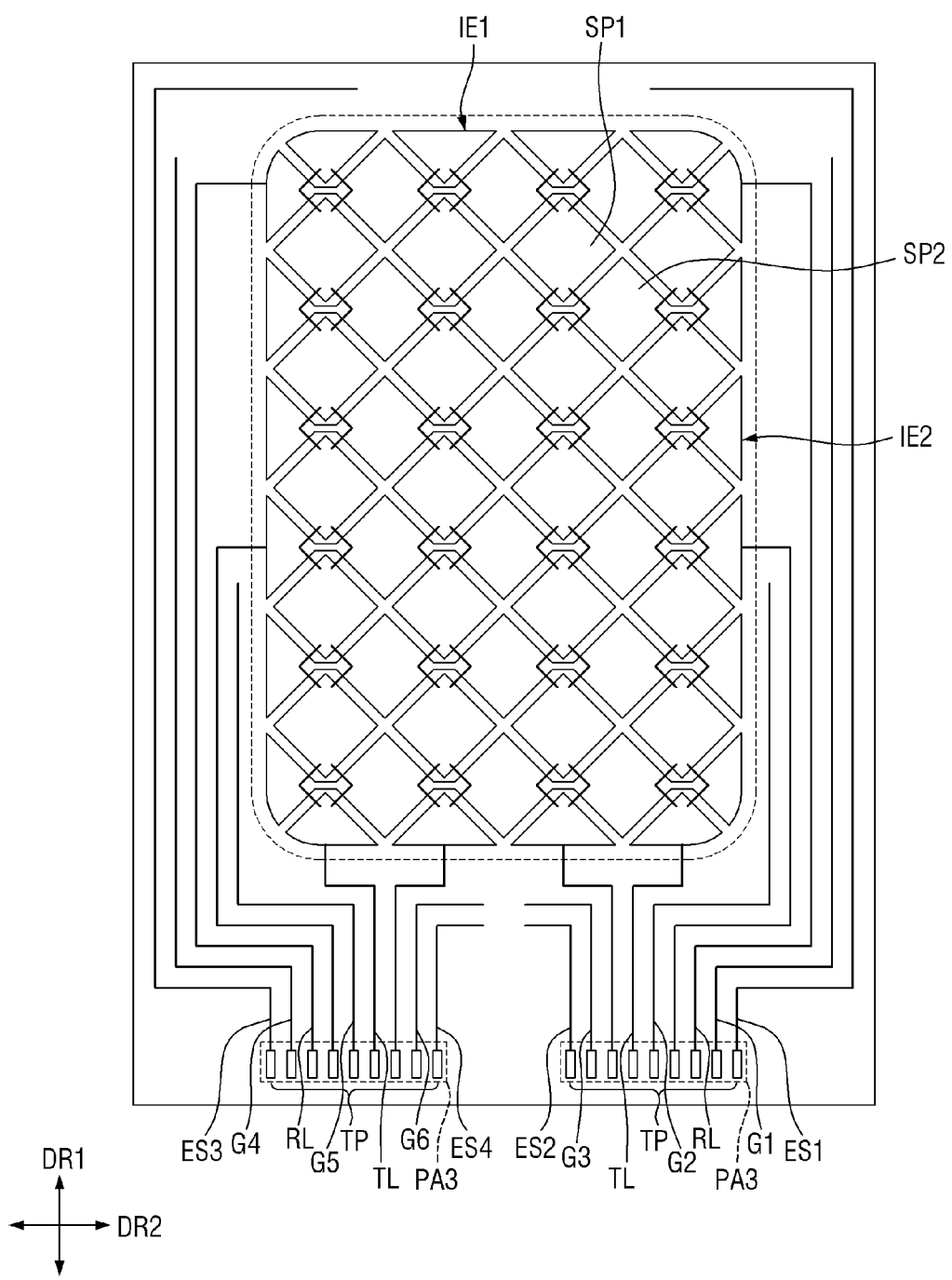
FIG. 8 is a plan view of a touch member according to an embodiment.

FIG. 8 is a plan view of a touch member according to an embodiment.

Referring to FIG. 8, the touch member may include a touch region located in the active area AAR and a non-touch region located in the non-active area NAR. Although the touch member is simplified while the non-touch region is exaggerated in size in FIG. 8 for convenience of illustration, the shapes of the touch region and the shape of the non-touch region may be substantially identical to those of the active area AAR and the non-active area NAR described above.

The touch region of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes while the second sensing electrodes IE2 are sensing electrodes.

The first sensing electrodes IE1 may be extended in the first direction DR1. The first sensing electrodes IE1 may include a plurality of first sensor parts SP1 arranged in the first direction DR1 and the first connecting parts CP1 electrically connecting between adjacent ones of the first sensor parts SP1.

The plurality of first sensing electrodes IE1 may be arranged in the second direction DR2.

The second sensing electrodes IE2 may be extended in the second direction DR2. The second sensing electrodes IE2 may include a plurality of second sensor parts SP2 arranged in the second direction DR2 and the second connecting parts CP2 electrically connecting between adjacent ones of the second sensor parts SP2. The plurality of second sensing electrodes IE2 may be arranged in the first direction DR1.

Although the four first sensing electrodes IE1 and the six second sensing electrodes IE2 are arranged in a particular manner in the drawing, it is to be understood that the numbers of the first sensing electrodes IE1 and the second sensing electrodes IE2 are not limited to the above numerical values.

At least some of the first sensor parts SP1 and the second sensor parts SP2 may have a diamond shape. Some of the first sensor parts SP1 and the second sensor parts SP2 may have a truncated diamond shape. For example, all of the first sensor parts SP1 and the second parts SP2 except the first and last ones in the extension direction may have a diamond shape, and each of the first and last ones in the extension direction may have a triangle shape obtained by cutting the diamond shape. The first sensor parts SP1 and the second sensor parts SP2 in the diamond shape may have substantially the same size and shape. The first sensor parts SP1 and the second sensor parts SP2 in the triangle shape may have substantially the same size and shape. It is, however, to be understood that the embodiments described herein are not limited thereto. The first sensor parts SP1 and the second sensor parts SP2 may have a variety of shapes and sizes.

Figure 9:
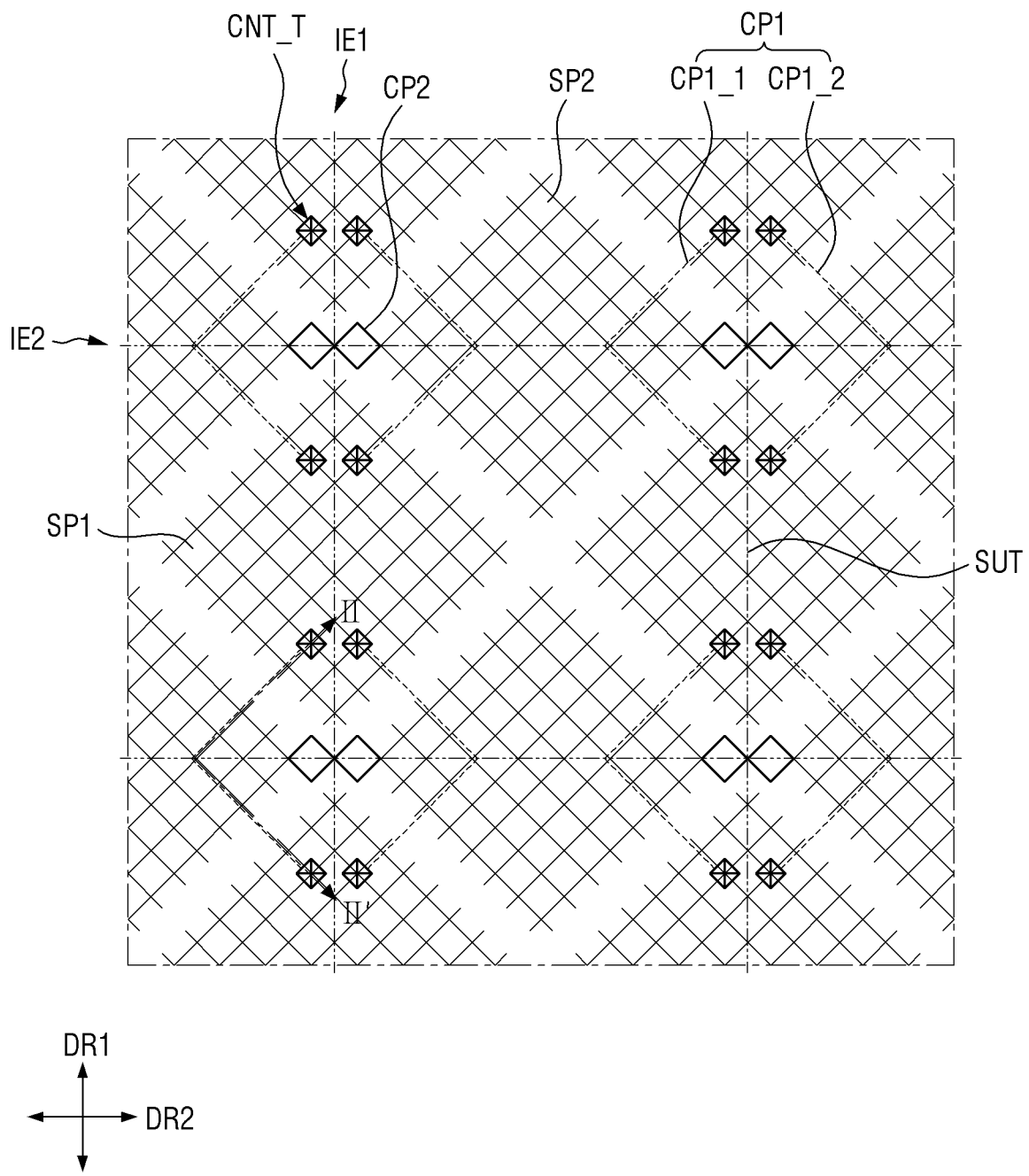
FIG. 9 is an enlarged view of a part of the touch region of FIG. 8.

The first sensor parts SP1 of the first sensing electrodes IE1 and the second sensor parts SP2 of the second sensing electrodes IE2 may each include a planar pattern or a mesh pattern. When the first sensor parts SP1 and the second sensor parts SP2 include a planar pattern, the first sensor parts SP1 and the second sensor parts SP2 may be formed as a transparent conductive layer. When the first sensor parts SP1 and the second sensor parts SP2 include a mesh pattern disposed along the non-emission areas as illustrated in FIGS. 8 and 9, it is possible to employ an opaque, low-resistance metal without interfering with the propagation of the emitted light. In the following description, the first sensor parts SP1 and the second sensor parts SP2 each include a mesh pattern. It is, however, to be understood that the embodiments described herein are not limited thereto.

Each of the first connecting parts CP1 may connect a vertex of the diamond or triangle shape of a first sensor part SP1 with that of an adjacent first sensor part SP1. Each of the second connecting parts CP2 may connect a vertex of the diamond or triangle shape of a second sensor part SP2 with that of an adjacent second sensor part SP2. The width of the first connecting parts CP1 and the second connecting parts CP2 may be smaller than the width of the first sensor parts SP1 and the second sensor parts SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer disposed on a different layer at the intersections, such that the first sensing electrodes IE1 can be insulated from the second sensing electrodes IE2. The first sensing electrodes IE1 can be connected to one another by the first connecting parts CP1 while the second sensing electrodes IE2 can be connected to one another by the second connecting parts CP2, so that they can be insulated from each other while intersecting each other. To do so, the first connecting parts CP1 and/or the second connecting parts CP2 may be located on a different layer from the first sensing electrode IE1 and the second sensing electrode IE2.

For example, the first sensor parts SP1 of the first sensing electrodes IE1 and the second sensor parts SP2 of the second sensing electrodes IE2 may be formed as a conductive layer located on the same layer, and the first sensor parts SP1 and the second sensor SP2 may neither intersect nor overlap with each other. The adjacent ones of the first sensor parts SP1 and second sensor parts SP2 may be physically separated from each other.

The second connecting parts CP2 may be formed as the same conductive layer as the second sensor parts SP2 and may connect the adjacent ones of the second sensor parts SP2. A first sensor part SP1 of a first sensing electrode IE1 is physically separated from an adjacent sensor part SP1 thereof with respect to the area where a second connecting part CP2 passes. The first connecting parts CP1 connecting the first sensor parts SP1 with one another may be formed as a different conductive layer from the first sensor parts SP1 and may traverse the area of the second sensing electrodes IE2. Each of the first connecting parts CP1 may be electrically connected to the respective first sensor parts SP1 by a contact.

There may be more than one first connecting parts CP1. For example, although not limited thereto, each of the first connecting parts CP1 may include a first connecting part CP1_1 which overlaps an adjacent second sensing electrode IE2 on one side, and another first connecting part CP1_2 which overlaps another adjacent second sensing electrode IE2 on the other side. As more than one first connecting parts CP1 connect between two adjacent ones of the first sensor parts SP1, it is possible to prevent disconnection of the first sensing electrodes IE1 even if any of the first connecting parts CP1 is broken by static electricity or the like.

The first sensor parts SP1 and the second sensor parts SP2 adjacent to each other may form a unit sensing region SUT (see FIG. 9). For example, halves of two adjacent first sensor parts SP1 and halves of two adjacent second sensor parts SP2 may form a square or a rectangle, with respect to the intersection between the first sensing electrodes IE1 and the second sensing electrodes 1E2. The area defined by the halves of the adjacent two first sensor parts SP1 and halves of the two adjacent second sensor parts SP2 may be a unit sensing region SUT. A plurality of unit sensing regions SUT may be arranged in row and column directions.

In each of the unit sensing regions SUT, the capacitance value between the adjacent first sensor parts SP1 and the second sensor parts SP2 is measured to determine whether or not a touch input is made, and if so, the position may be obtained as touch input coordinates. For example, a touch may be sensed by, for example, measuring mutual capacitance.

Each unit sensing region SUT may be larger than the size of a pixel. For example, each unit sensing region SUT may have an area equal to the area occupied by a plurality of pixels. The length of a side of the unit sensing area SUT may be in the range of, but is not limited to, 4 to 5 mm.

A plurality of touch signal lines is disposed in the non-active area NAR outside the touch region. The touch signal lines may be extended from the third pad area PA3 located in the subsidiary region SR to the non-active area NAR of the main region MR through the bending region BR.

The plurality of touch signal lines includes a plurality of touch driving lines TL and a plurality of touch sensing lines RL. In an embodiment, the touch signal lines may further include touch ground lines G1 to G6 and/or touch antistatic lines ES1 to ES4.

The touch driving lines TL are connected to the first sensing electrodes IE1. In an embodiment, a plurality of touch driving lines may be connected to a single first sensing electrode IE1. For example, the touch driving lines TL may be connected to the lower ends of the first sensing electrodes IE1. In some other embodiments, the touch driving lines TL may be connected to the upper ends of the first sensing electrodes IE1 as well. In yet some other embodiments, the touch driving lines TL may be connected to the upper ends as well as lower ends of the first sensing electrodes IE1. The plurality of touch driving lines TL may be extended from the touch pads TP in the first direction DR1 toward the upper side and may be connected to the lower ends of the first sensing electrodes IE1.

The touch sensing lines RL are connected to the second sensing electrodes IE2. In an embodiment, two touch sensing lines RL may be connected to a single second sensing electrode IE2. The touch sensing lines RL extended from the touch pads TP in the third pad area PA3 on the second side of the second direction DR2 may be extended in the first direction DR1 toward the left edge of the touch region to be connected to the left ends of the second sensing electrodes IE2. The touch sensing lines RL extended from the touch pads TP in the third pad area PA3 on the first side of the second direction DR2 may be extended in the first direction DR1 toward the right edge of the touch region to be connected to the right ends of the second sensing electrodes IE2.

The antistatic lines ES1 to ES4 may be disposed at the outermost positions of the touch signal lines. In an embodiment, the touch antistatic lines may include a first touch antistatic line ES1, a second touch antistatic line ES2, a third touch antistatic line ES3, and a fourth touch antistatic line ES4. The first to fourth touch antistatic lines ES may surround the touch region and the signal lines in a ring shape.

The first touch antistatic line ES1 may be disposed on the outer side of the touch signal lines located on the right hand to cover them. The second touch antistatic line ES2 may be disposed on the inner side of the touch signal lines located on the right hand to cover them. The third touch antistatic line ES3 may be disposed on the outer side of the touch signal lines located on the left hand to cover them. The fourth touch antistatic line ES4 may be disposed on the inner side of the touch signal lines located on the left hand to cover them.

The touch ground lines G may be disposed between the signal lines. The touch ground lines G may include a first touch ground line G1, a second touch ground line G2, a third touch ground line G3, a fourth touch ground line G4, a fifth touch ground line G5 and a sixth touch ground line G6.

The first touch ground line G1 may be disposed between the touch sensing line RL and the first touch antistatic line ES1. The second touch ground line G2 may be disposed between the touch driving line TL and the touch sensing line RL. The third touch ground line G3 may be disposed between the second antistatic line ES2 and the touch driving line TL. The fourth touch ground line G4 may be disposed between the third touch antistatic line ES3 and the touch sensing line RL. The fifth touch ground line G5 may be disposed between the touch driving line TL and the touch sensing line RL. The sixth touch ground line G6 may be disposed between the fourth antistatic line ES4 and the touch driving line TL.

Figure 10:
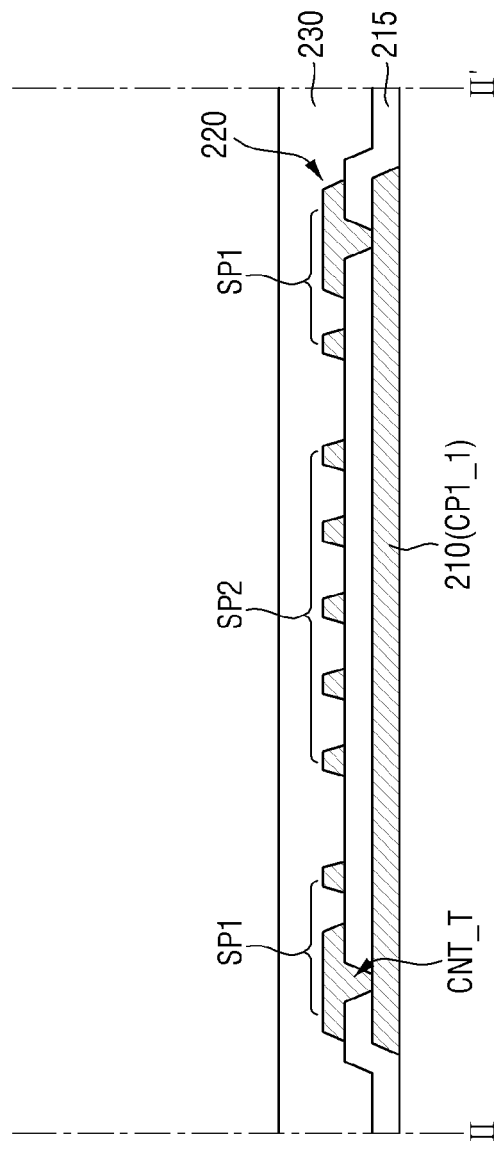
FIG. 10 is a cross-sectional view taken along line II-II' of FIG. 9.

FIG. 9 is an enlarged view of a part of the touch region of FIG. 8. FIG. 10 is a cross-sectional view taken along line II-II' of FIG. 9.

Referring to FIGS. 8 to 10, the touch member may include a first touch conductive layer 210, a first touch insulating layer 215 on the first touch conductive layer 210, a second touch conductive layer 220 on the first touch insulating layer 215, and a second touch insulating layer 230 covering the second touch conductive layer 220. In some embodiments, the touch member may further include a base layer disposed under the first touch conductive layer 210. The base layer may include an inorganic insulating material.

Specifically, the first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

Each of the first touch conductive layer 210 and the second touch conductive layer 220 may include a metal or a transparent conductive layer. The metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc. As described above, when the first touch conductive layer 210 and the second touch conductive layer 220 are disposed on the non-emission area, they do not interfere with the propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

In an embodiment, the first connecting parts CP1 may be formed as the first touch conductive layer 210 while the first sensor parts SP1, the second sensor parts SP2 and the second connecting parts CP2 may be formed as the second touch conductive layer 220. It is, however, to be understood that the embodiments described herein are not limited thereto. On the contrary, the first connecting parts CP1 may be formed as the second touch conductive layer 220 while the sensor parts SP1 and SP2 and the second connecting parts CP2 may be formed as the first touch conductive layer 210. The touch signal lines may be formed as either the first touch conductive layer 210 or the second touch conductive layer 220. Alternatively, they may be formed as the first touch conductive layer 210 and the second touch conductive layer 220 connected by a contact. Besides, the touch conductive layers forming the elements of the sensing electrodes and the signal lines may be modified in a variety of ways.

The first touch insulating layer 215 and the second touch insulating layer 230 may include an inorganic material or an organic material. In an embodiment, the first touch insulating layer 215 or the second touch insulating layer 230 may include an inorganic material and the other may include an organic material. According to an embodiment, the first touch insulating layer 215 may include a silicon nitride layer, a silicon oxynitride layer, a silicon oxide layer, a titanium oxide layer, or an aluminum oxide layer. The second touch insulating layer 230 may include at least one of an acrylic resin, a methacrylic resin, a polyisoprene, a vinyl resin, an epoxy resin, a urethane resin, a cellulose resin, a siloxane resin, a polyimide resin, a polyamide resin and a phenolic resin.

The first touch insulating layer 215 may include a contact hole CNT_T. The first touch conductive layer 210 (e.g., the first connecting part CP1) and a part of the second touch conductive layer 220 (e.g., the first sensor part SP1) may be electrically to each other through the contact hole CNT_T.

Figure 11:
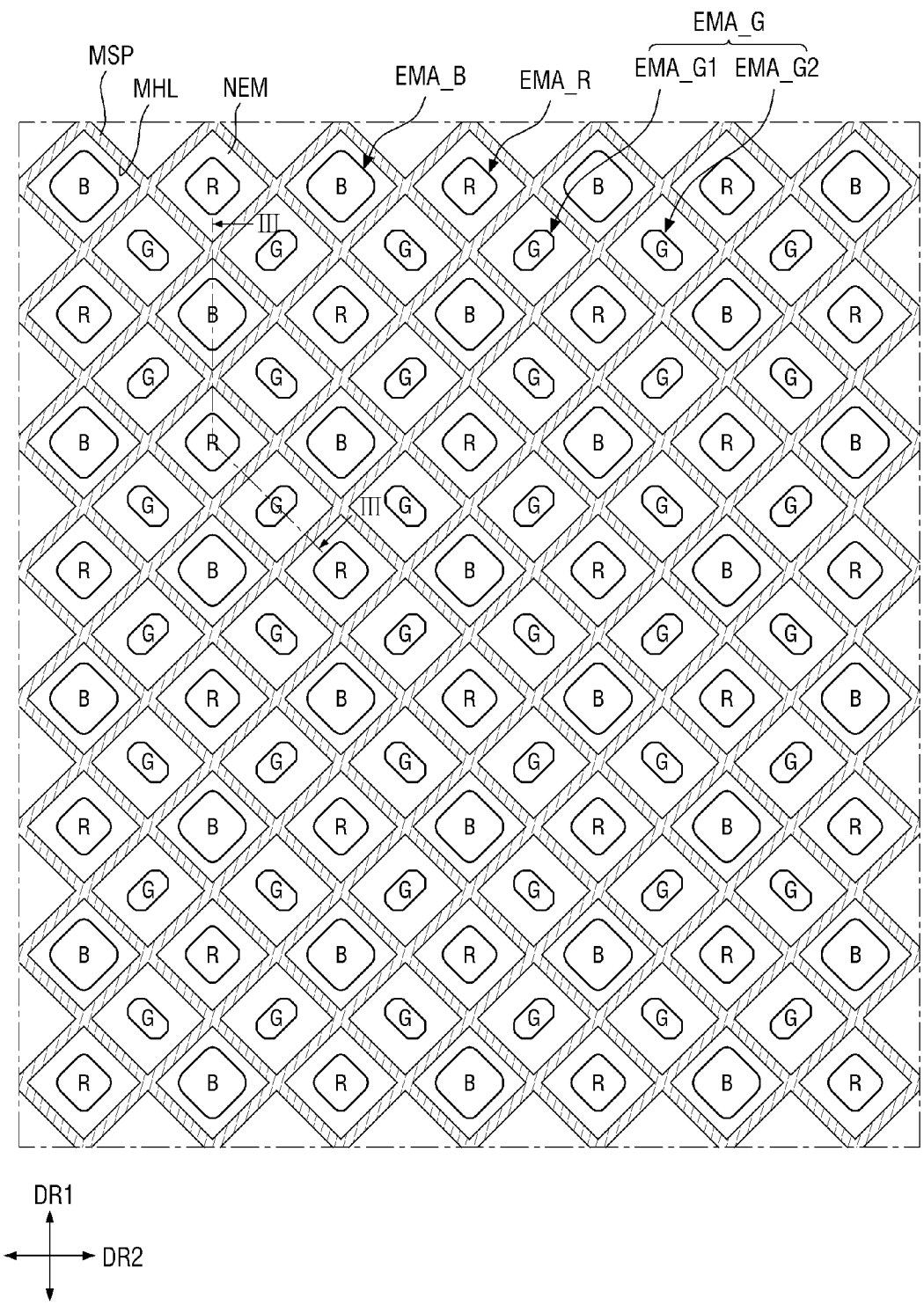
FIG. 11 is a diagram showing the relative arrangement relationship between the pixels and the touch member in a mesh pattern in the display area according to an embodiment.
Figure 12:
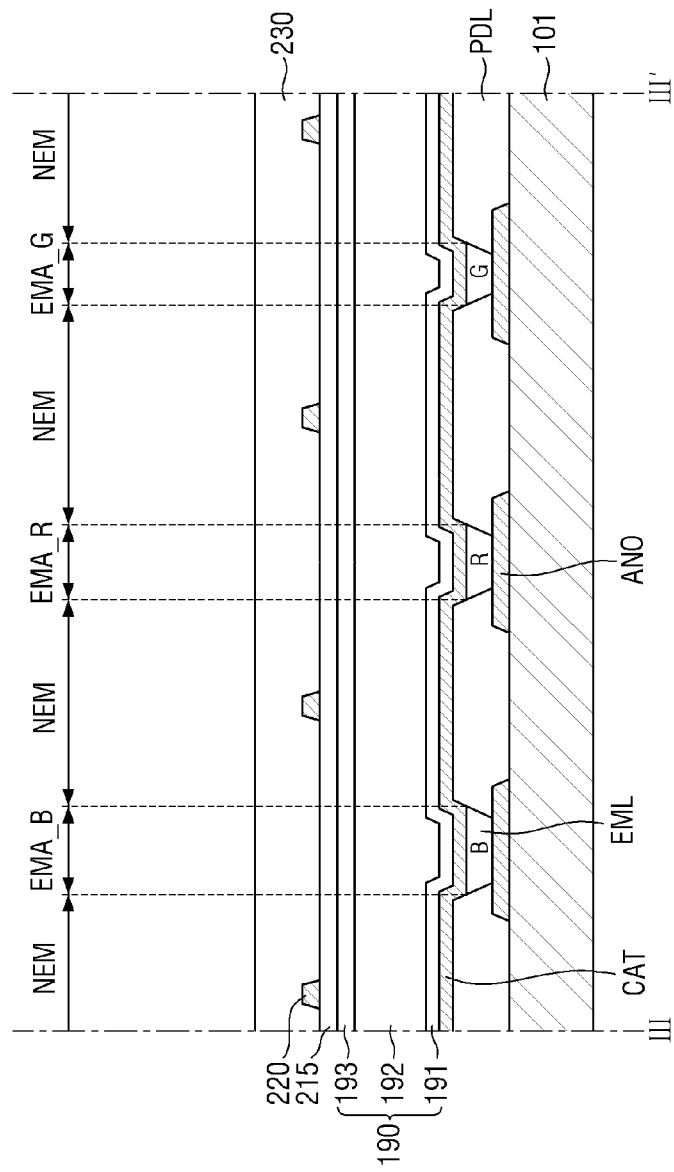
FIG. 12 is a cross-sectional view taken along line III-III' of FIG. 11.

FIG. 11 is a diagram showing the relative arrangement relationship between the pixels and the touch member in a mesh pattern in the display area according to an embodiment. FIG. 12 is a cross-sectional view taken along line III-III' of FIG. 11. In the cross-sectional view of FIG. 12, most of the layers under an anode electrode ANO are not shown and the structure above an organic light-emitting element is mainly shown.

Referring to FIGS. 11 and 12, the display area of the active area AAR includes a plurality of pixels PX (see FIG. 4). Each of the pixels PX includes an emission area EMA. The emission area EMA overlaps with an opening of the bank layer PDL and may be defined thereby. A non-emission area NEM is disposed between the emission area EMA of a pixel PX and the emission area EMA of another pixel PX. The non-emission area NEM overlaps with the bank layer PDL and may be defined thereby. The non-emission area NEM may surround the emission area EMA. The non-emission area NEM has a lattice shape or a mesh shape arranged along the diagonal directions intersecting with the first direction DR1 and the second direction DR2 when viewed from the top. The mesh pattern MSP is disposed in the non-emission area NEM.

The pixels may include first color pixels (e.g., red pixels), second color pixels (e.g., blue pixels), and third color pixels (e.g., green pixels). The shape of the emission area EMA of each color pixel may be generally an octagon, a square or a diamond with rounded corners. It is, however, to be understood that the embodiments described herein are not limited thereto. The shape of each emission area EMA may be a circle, or other polygons with or without rounded corners.

In an embodiment, the emission area EMA_R of the first color pixel and the emission area EMA_B of the second color pixel may have similar shapes such as a diamond shape with rounded corners. The emission area EMA_B of the second color pixel may be larger than the emission area EMA_R of the first color pixel.

The emission area EMA_G of the third color pixel may be smaller than the emission area EMA_R of the first color pixel. The emission area EMA_G of the third color pixel may have an octagon shape that is inclined in a diagonal direction and having the maximum width in the inclined direction. The third color pixels may include third color pixels in which an emission area EMA_G1 is inclined in a first diagonal direction, and third color pixels in which an emission area EMA_G2 is inclined in a second diagonal direction.

The color pixels may be arranged in a variety of ways. In an embodiment, the first color pixels (e.g., red pixels) and the second color pixels (e.g., blue pixels) may be alternately arranged in the second direction DR2 to form a first row, while third color pixels (e.g., green pixels) may be arranged in the second direction DR2 to form a second row next to the first row. The pixels belonging to the second row (the third color pixels) may be arranged in a staggered manner in the second direction DR2 with respect to the pixels belonging to the first row. In the second row, the third color pixels that are inclined in the first diagonal direction EMA_G1 and the third color pixels that are inclined in the second diagonal direction EMA_G2 may be alternately arranged in the second direction DR2. The number of the third color pixels belonging to the second row may be twice the number of the first color pixels or the second color pixels belonging to the first row.

In the third row, the color pixels of the same colors as the first row may be arranged in the reversed order. Specifically, in a column of the first row where a first color pixel is disposed, a second color pixel is disposed in the same column of the third row. In a column of the first row where a second color pixel is disposed, a first color pixel is disposed in the same column of the third row. In the fourth row, the third color pixels are arranged like the second row but they may be arranged in the reversed order in view of the shapes inclined with respect to the diagonal directions. Specifically, in a column of the second row where a third color pixel inclined in the first diagonal direction is disposed, a third color pixel inclined in the second diagonal direction is disposed in the same column of the fourth row. In a column of the second row where a third color pixel inclined in the second diagonal direction is disposed, a third color pixel inclined in the first diagonal direction is disposed in the same column of the fourth row.

The arrangement of the first to fourth rows may be repeated in the first direction DR1. It is to be understood that the arrangement of the pixels is not limited to the above example.

The mesh pattern MSP may be disposed along the boundaries of the pixels in the non-emission area NEM. The mesh pattern MSP may not overlap with the emission area EMA. The width of the mesh pattern MSP may be smaller than the width of the non-emission area NEM. In an embodiment, mesh holes MEL exposed by the mesh pattern MSP may have a substantially diamond shape. The mesh holes MHL may have the same size. Alternatively, the mesh holes MHL may have different sizes either depending on the size of the emission area EMA exposed via the mesh holes MHL or regardless of it. Although a single mesh hole MHL is formed in a single emission area EMA in the drawing, this is merely illustrative. In some implementations, a single mesh hole MHL may be formed across two or more emission areas EMA.

Referring to FIG. 12, a substrate 101 of the display device 1 may be made of an insulating material such as a polymer resin Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 101 may be a flexible substrate that can be bent, folded, or rolled. An example of the material of the flexible substrate may be, but is not limited to, polyimide (PI).

The anode electrode ANODE is disposed on the substrate 101. The anode electrode ANO is disposed directly on the substrate 101 for convenience of illustration. However, as is well known in the art, a plurality of thin-film transistors and signal lines may be disposed between the substrate 101 and the anode electrode ANO.

The anode electrode ANO may be a pixel electrode disposed in each of the pixels. The anode electrode ANO may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or a mixture thereof. A layer having a higher work function may be disposed above a reflective material layer so that it is disposed closer to the emissive layer. The anode electrode ANO may have, but is not limited to, a multilayer structure of ITO/Mg, ITO/MgF, ITO/Ag, and ITO/Ag/ITO.

The bank layer PDL may be disposed on the substrate 101. The bank layer PDL may be disposed over the anode electrode ANO and may include an opening exposing the anode electrode ANO. The emission area EMA and the non-emission area NEM may be separated by the bank layer PDL and the openings thereof. The bank layer PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The bank layer PDL may include an inorganic material.

The emissive layer is disposed on the anode electrode ANO exposed via the bank layer PDL. The emissive layer may include the organic layer EML. The organic layer EML may include an organic emissive layer and may further include a hole injecting/transporting layer and/or an electron injecting/transporting layer.

A cathode electrode CAT may be disposed on the organic layer EML. The cathode electrode CAT may be a common electrode disposed across the pixels. The anode electrode ANO, the organic layer EML and the cathode electrode CAT may form an organic light-emitting element.

The cathode electrode CAT may be in contact with the organic layer EML as well as the upper surface of the bank layer PDL. The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

An thin encapsulation layer 190 including a first inorganic layer 191, an organic layer 192 and a second inorganic layer 193 is disposed on the cathode electrode CAT. Each of the first inorganic film 191 and the second inorganic film 193 may include silicon nitride, silicon oxide, silicon oxynitride, or the like. The organic layer 192 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The first touch insulating layer 215, the second touch conductive layer 220 and the second touch insulating layer 230 may be sequentially disposed on the thin-film encapsulation layer 190. The layers have been described above; and, therefore, the redundant description will be omitted for sake of brevity. FIG. 12 is a cross-sectional view of the sensor part, and therefore, the first touch conductive layer 210 is not shown in the cross-sectional view.

The second touch conductive layer 220 may overlap with the bank layer PDL and may be disposed in the non-emission area NEM. The second touch conductive layer 220 forms the mesh pattern MSP of the sensor parts and does not interfere with emission because it does not overlap with the emission area EMA, and is not be seen by a viewer.

Figure 13:
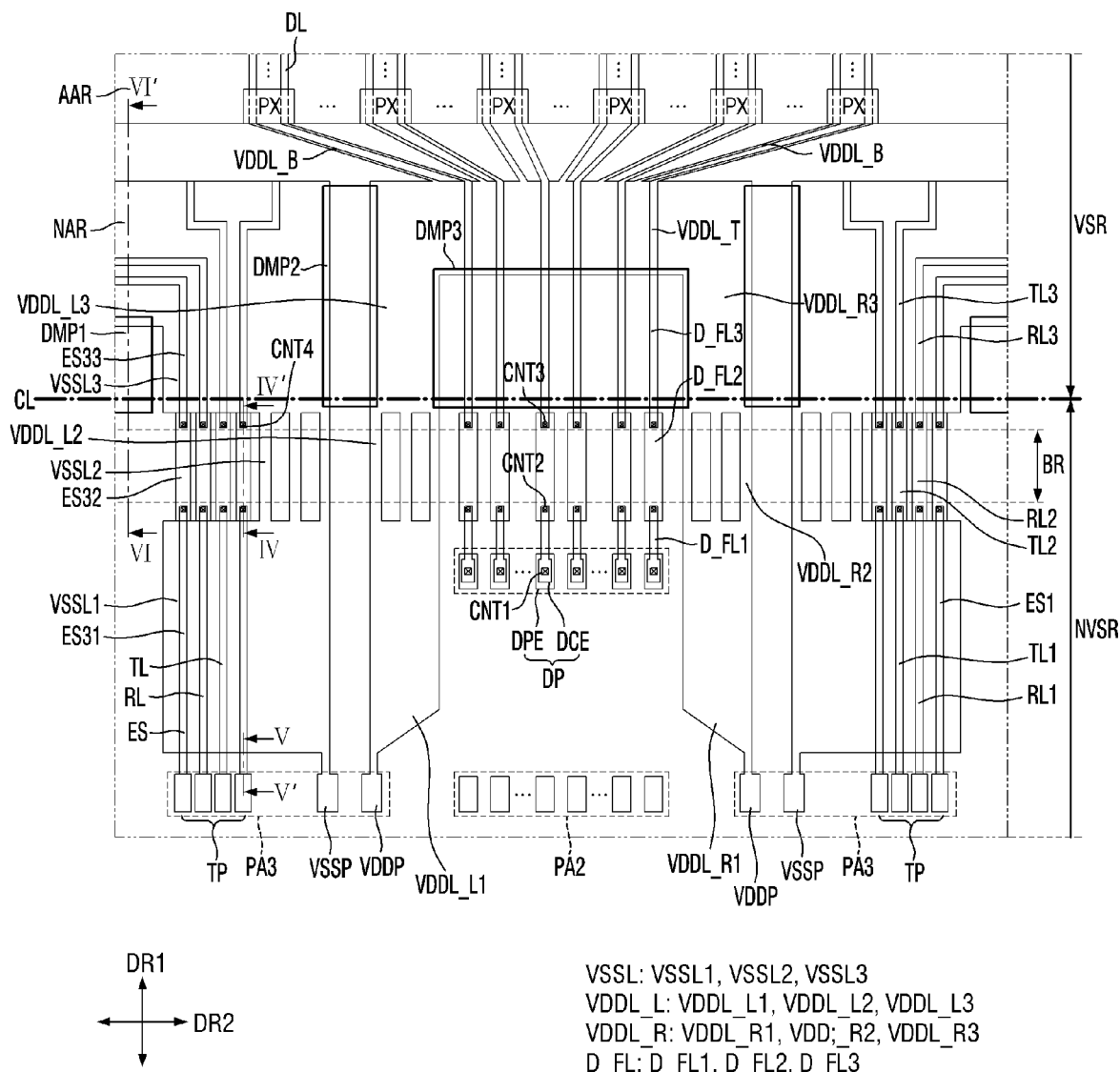
FIG. 13 is an enlarged plan view of a part of an active area and a non-active area according to an embodiment.

FIG. 13 is an enlarged plan view of a part of an active area and a non-active area according to an embodiment. FIG. 13 further shows touch pads TP and touch signal lines connected to the touch pads TP in the plan view of FIG. 6. For convenience of illustration, a third touch antistatic line ES3, a touch sensing line RL and two touch driving lines TL are shown on the second side of the second direction DR2 among the touch pads TP and the touch signal lines, and a first touch antistatic line ES1, a touch sensing line RL and two touch driving lines TL are shown on the first side of the second direction DR2 among the touch pads TP and the touch signal lines. The touch pads TP and the touch signal lines on the second side of the second direction DR2 and the touch pads TP and the touch signal lines on the first side of the second direction DR2 are symmetrical to each other in the second direction DR2 and have the same shape. Accordingly, only the touch pads TP and the touch signal lines on the second side of the second direction DR2 will be described while those on the first side of the second direction DR2 will not, for sake of brevity.

The touch sensing lines RL, the touch driving lines TL and the third touch antistatic line ES3 may be extended from the touch pads TP toward the active area AAR.

The touch sensing lines RL, the touch driving lines TL and the third touch antistatic line ES3 may include line parts RL1 to RL3, TL1 to TL3 and ES31 to ES33, respectively, which are located at different positions. The line parts RL1 to RL3, TL1 to TL3 and ES31 to ES33 have substantially the same constituent materials and cross-sectional shapes except their positions at which they overlap the second supply voltage signal line part VSSL2. Accordingly, only the line parts RL1 to RL3 will be described and the other line parts TL1 to TL3 and ES31 to ES33 will not be described unless specifically required.

The touch sensing lines RL may include a first touch sensing line part RL1 physically connected to the touch pad TP, a second touch sensing line RL2 connected to the first touch sensing line part RL1 and disposed in the bending region BR, and a third touch sensing line part RL3 connected to the second touch sensing line part RL2. The first touch sensing line part RL1 may be extended in the first direction DR1 from the touch pad TP and terminated before the bending region BR, and the end of the first touch sensing line part RL1 may be connected to the second touch sensing line part RL2 through a contact.

That is to say, the first touch sensing line part RL1 and the third touch sensing line part RL3 may be connected to the second touch sensing line part RL2 through contact holes CNT4 in the non-visible area NVSR adjacent to the bending region BR. The third touch sensing line part RL3 may be extended from the non-visible region NVSR to the visible region VSR. The second touch sensing line part RL2 may be disposed in the bending region BR. In order to avoid interference of the sensing voltage of the touch sensing lines RL and the driving voltage of the touch driving lines TL with adjacent signal lines, the touch sensing lines RL and the touch driving lines TL may generally overlap the first supply voltage signal line VSSL thereunder except the bending region BR. In the bending region BR, a more flexible material may be applied in order to prevent disconnection or cracks of the touch sensing line RL and the touch driving line TL.

Figure 14:
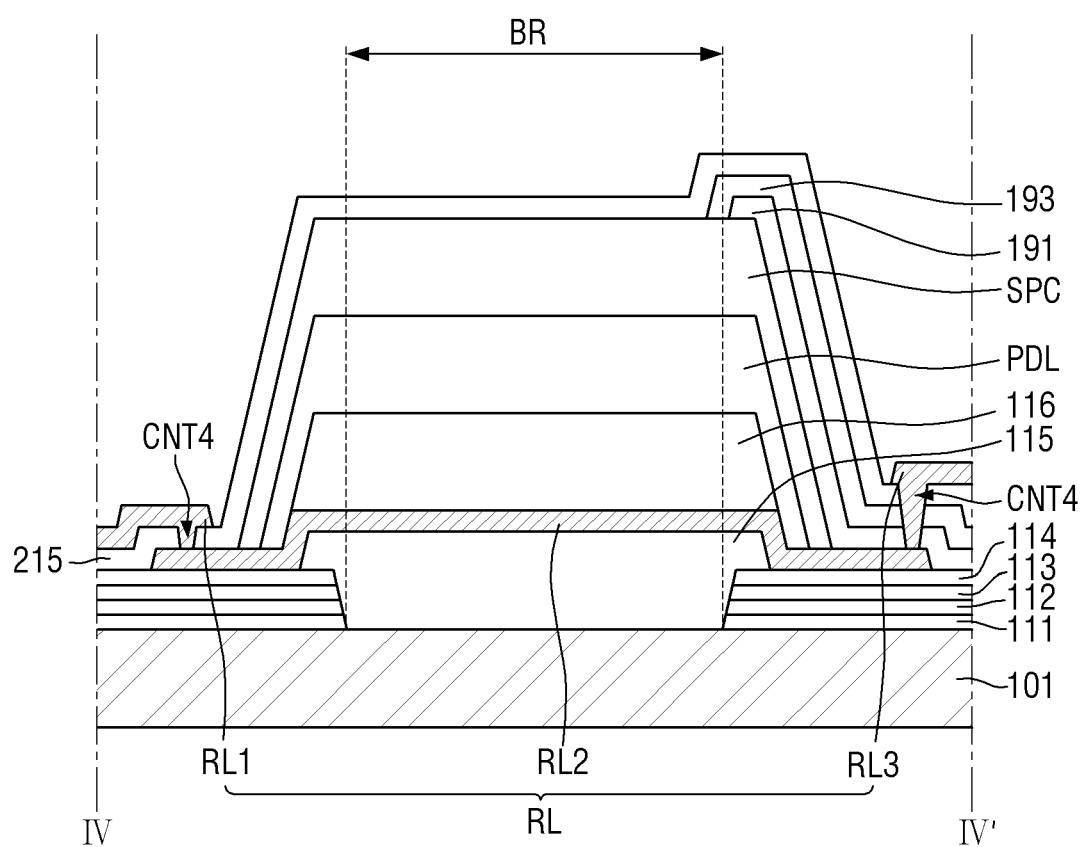
FIG. 14 is a cross-sectional view taken along line IV-IV' of FIG. 13.

As shown in FIG. 14, the second touch sensing line part RL2 may be located on a conductive layer different from the first touch sensing line part RL1 and the third touch sensing line part RL3. More specifically, the display panel may further include a second via layer 116 on the second source-drain conductive layer, a bank layer PDL on the second via layer 116, a spacer SPC on the bank layer PDL, a thin-film encapsulation layer 190 on the spacer SPC, a first touch insulating layer 215 on the thin-film encapsulation layer 190, and a second touch conductive layer 220 (see FIG. 10) on the first touch insulating layer 215.

The second source-drain conductive layer may include the second touch sensing line part RL2, and the second touch conductive layer 220 may include the first and third touch sensing line parts RL1 and RL3.

The first touch sensing line part RL1 and the third touch sensing line part RL3 may be physically spaced apart from each other. The second touch sensing line part RL2 may be connected to the first touch sensing line part RL1 through the contact hole CNT4 penetrating the first touch insulating layer 215 and may be connected to the third touch sensing line part RL3 through the contact hole CNT4 penetrating the first touch insulating layer 215, the first inorganic layer 191 and the second inorganic layer 193.

As the panel is bent in the bending region BR, the elements located there may be bent together. When the second touch sensing line part RL2 is disposed on the second source-drain conductive layer and is bent, the radius of curvature may become smaller than that when it is disposed on the second touch conductive layer 220 and is bent. Accordingly, the bending stress can be reduced, so that it is possible to prevent breakage or cracks. Further, when the second touch sensing line part RL2 is disposed on the second source-drain conductive layer, stress may be relieved through the second via layer 116 thereon and the first via layer 115 thereunder.

Since the touch signal lines such as the second touch sensing line part RL2 are formed by applying the constituent material of the second source-drain conductive layer in the bending region BR, and the first supply voltage signal line VSSL adjacent to the touch signal lines is also formed by applying the conductive layer, the second supply voltage signal line part VSSL2 is connected only to the sides of the adjacent supply voltage signal line parts VSSL1 and VSSL3 on the first side of the second direction DR2 while not to the sides thereof on the second side of the second direction DR2. Accordingly, it is possible to prevent a short circuit between the touch signal lines and the second supply voltage line part VSSL2 in the bending region.

Incidentally, as shown in FIG. 13, there may be an area where no signal line is disposed in the visual region VSR that is recognized by a user. Light reflected from the area where signal lines are disposed may be seen darker by a user, whereas light reflected from the area where no signal line is disposed may be seen brighter by the user. In particular, a difference in black color may be recognize between the area where the signal lines of the source-drain conductive layers and the touch conductive layers relatively close to a window member are disposed and the area wherein those signal lines are not disposed.

For example, in order to reduce the non-active area NAR and/or to avoid the interfere with signal lines of the other driving circuits, the first supply voltage signal line VSSL may pass through the boundary line CL between the visible region VSR and the non-visible region NVSR and may be bent in the second direction DR2 near the active area AAR. Accordingly, there may be created an area where the conductive layers including the source-drain conductive layer are not disposed (hereinafter referred to as a first line-free area) at the boundary line CL between the first supply voltage signal line VSSL and the third supply voltage signal line part VSSL3.

Moreover, in order to avoid a short circuit between the first supply voltage signal line VSSL and the second supply voltage signal line VDDL located on the same layer, the first supply voltage signal line VSSL and the second supply voltage signal line VDDL are located such that they are spaced apart from each other in the second direction DR2 with a predetermined spacing distance. As a result, an area where no line is disposed may be created between the boundary line CL and the spacing of the first supply voltage signal line VSSL and the second supply voltage signal line VDDL (hereinafter referred to as a second line-free area).

In addition, an area where no line is disposed (hereinafter referred to as a third line-free area) may be created in a space surrounded by the left second supply voltage signal line VDDL_L and the right second supply voltage signal line VDDL_R of the second supply voltage signal line VDDL, the connection second supply voltage signal line VDDL_T and the boundary line CL.

According to an embodiment, dummy patterns are disposed in such line-free areas, which are located on the same layer as or at least above the source-drain conductive layer. Accordingly, it is possible to prevent a difference in visual sensation in black between the area where the signal lines of the source-drain conductive layers and the touch conductive layers are disposed and the line-free areas in the visible region VSR.

The dummy patterns may include a first dummy pattern DMP1 disposed in the first line-free area, a second dummy pattern DMP2 disposed in the second line-free area, and a third dummy pattern DMP3 disposed in the third line-free area. Each of the dummy patterns DMP1, DMP2 and DMP3 may be located on the same layer as or at least an upper layer of the source-drain conductive layer. According to an embodiment, each of the dummy patterns DMP1, DMP2 and DMP3 may be disposed on the second touch conductive layer 220 or the first touch conductive layer 210. According to an embodiment, each of the dummy patterns DMP1, DMP2 and DMP3 is illustrated as being disposed on the second touch conductive layer 220, but the embodiments described herein are not limited thereto. Each of the dummy patterns DMP1, DMP2 and DMP3 may be disposed at least one of the touch conductive layers 210 and 220. Each of the dummy patterns DMP1 to DMP3 may have a width greater than the width of the touch signal lines.

Each of the dummy patterns DMP1, DMP2 and DMP3 may be disposed in the visible region VSR, and may overlap the boundary line CL between the visible region VSR and the non-visible region NVSR. Each of the dummy patterns DMP1, DMP2 and DMP3 may be designed to have an area equal to the respective line-free areas in order to reduce the line-free areas. Each of the shielding layer patterns DMP1, DMP2, and DMP3 may have a planar pattern as shown in FIG. 13. Furthermore, since the dummy patterns DMP1, DMP2 and DMP3 are disposed on the touch conductive layers 210 and 220, signal interference may occur in the touch signal lines by adjacent dummy patterns DMP1, DMP2 and DMP3. Accordingly, the dummy patterns DMP1, DMP2 and DMP3 may be spaced apart from adjacent touch signal lines, with a spacing distance that is equal to or greater than the spacing distance between the adjacent touch signal lines.

The first dummy pattern DMP1 disposed in the first line-free area may overlap the boundary line CL. According to an embodiment, the first dummy pattern DMP1 may overlap at least a part of the third supply voltage signal line part VSSL3 of the first supply voltage signal line VSSL. At least a part of the first dummy pattern DMP1 may overlap a part of the third supply voltage signal line part VSSL3 that is bent in the second direction DR2.

The second dummy pattern DMP2 disposed in the second line-free area may overlap the boundary line CL. According to an embodiment, the second dummy pattern DMP2 may overlap at least a part of the third supply voltage signal line part VSSL3 of the first supply voltage signal line VSSL and at least a part of the third supply voltage signal line parts VDDL_L3 and VDDL_R3 of the second supply voltage signal lines VDDL_L and VDDL_R.

The third dummy pattern DMP3 disposed in the third line-free area may overlap the boundary line CL. According to an embodiment, the third dummy pattern DMP3 may overlap at least a part of the second supply voltage signal lines VDDL_L, VDDL_R and VDDL_T. For example, the third dummy pattern DMP3 may overlap at least a part of the third supply voltage signal line part VDDL_L3 of the left second supply voltage signal line VDDL_L, the third supply voltage signal line part VDDL_R3 of the right second supply voltage signal line VDDL_R, and at least a part of the connection second supply voltage signal line VDDL_T.

Figure 15:
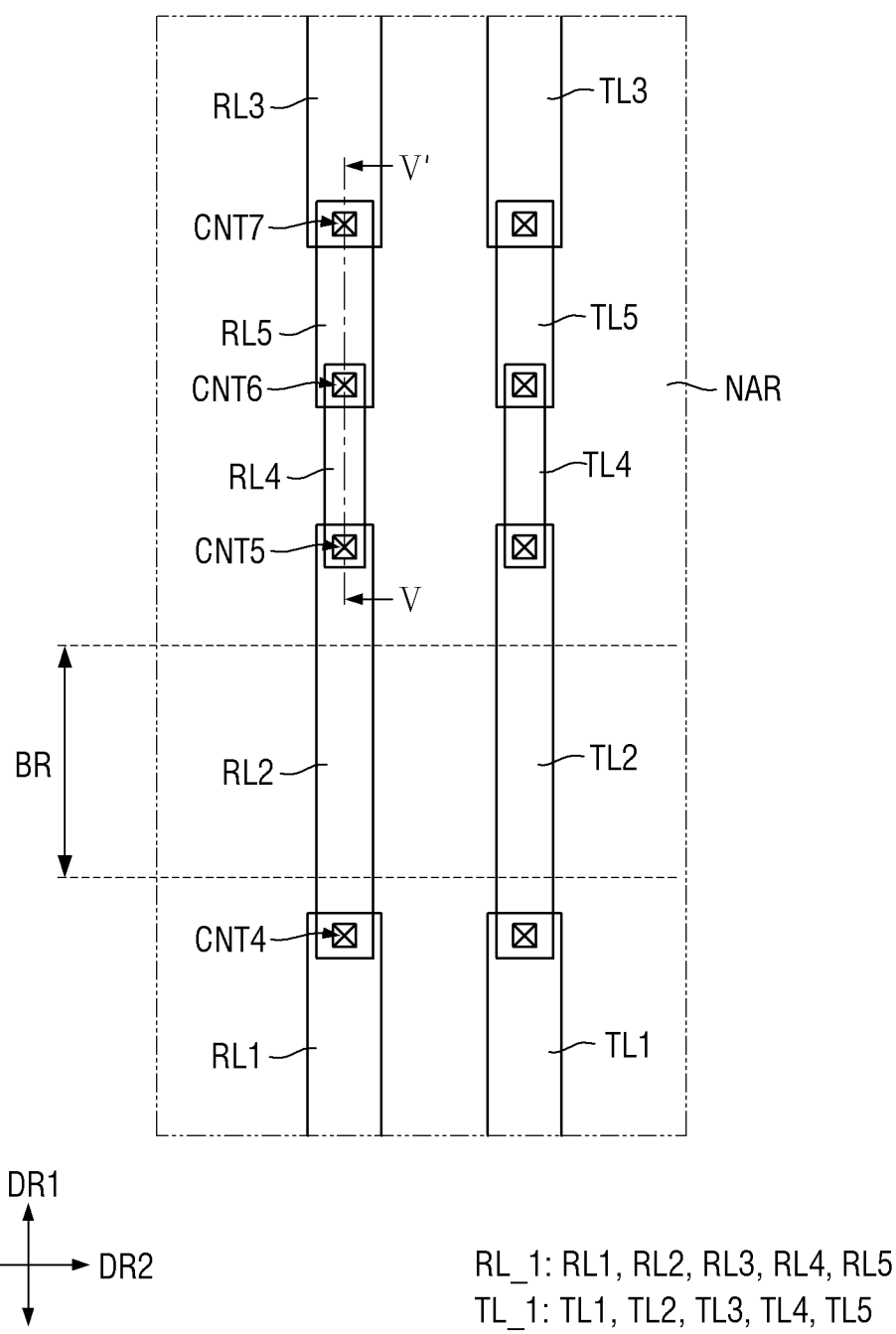
FIG. 15 is a plan view showing a modification of the touch driving lines and the sensing driving lines of FIG. 13.
Figure 16:
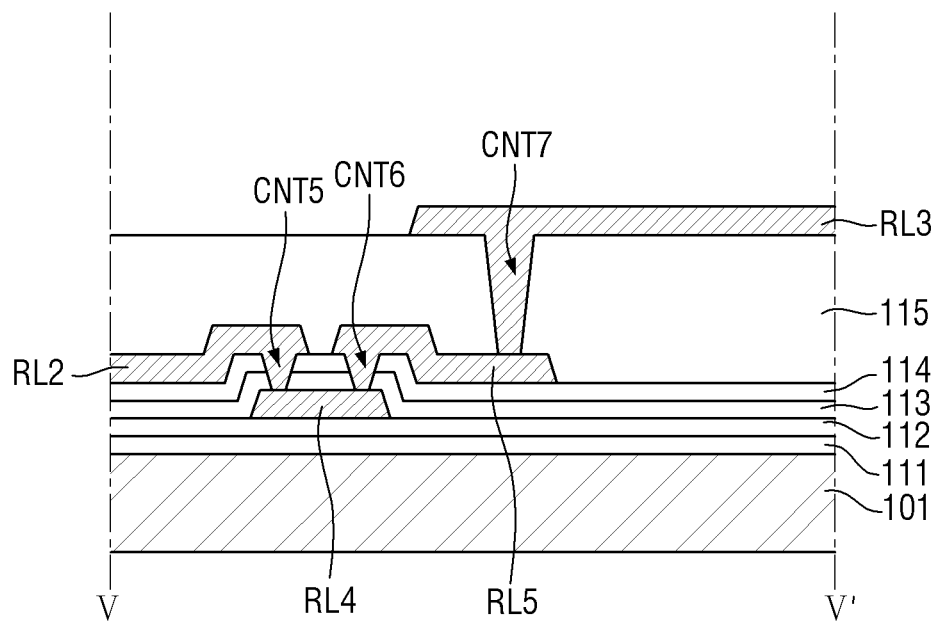
FIG. 16 is a cross-sectional view taken along line V-V of FIG. 15.

FIG. 15 is a plan view showing a modification of the touch driving lines and the sensing driving lines of FIG. 13. FIG. 16 is a cross-sectional view taken along line V-V of FIG. 15. Although FIG. 15 shows a modification in terms of a conductive layer forming a touch driving line TL_1 and a touch sensing line RL_1, the other touch signal lines of the touch driving line TL_1 and the touch sensing line RL_1 shown in FIG. 13 may also be modified in the same manner described with reference to FIG. 15.

Referring to FIGS. 15 and 16, the touch driving line TL_1 and the touch sensing line RL_1 according to the modification may further include other line parts. For example, the touch sensing line RL_1 may further include a fourth touch sensing line part RL4 connecting the second touch sensing line part RL2 with the third touch sensing line part RL3, and a fifth touch sensing line unit RL5 connecting the fourth touch sensing line part RL4 with the third touch sensing line part RL3. The touch driving line TL_1 may further include a fourth touch driving line part TL4 connecting the second touch driving line part TL2 with the third touch driving line part TL3, and a fifth touch driving line part TL5 connecting a fourth touch driving line part TL4 with the third touch driving line part TL3.

The planar shape, cross-sectional shape and cross-sectional structure of each of the line parts of a touch driving line TL2_1 added according to this modification are substantially identical to those of each of the line parts of a touch sensing line RL2_1. Accordingly, only the line parts of the touch driving line TL2_1 will be described and the line parts of the touch sensing line RL2_1 will not be described unless specifically required.

The ends of the fourth touch sensing line part RL4 disposed on the gate conductive layer may be connected to the second touch sensing line part RL2 and the fifth touch sensing line part RL5 through contact holes CNT5 and CNT6 penetrating the second gate insulating layer 113 and the interlayer dielectric layer 114, respectively, on the first side of the bending region BR in the first direction DR1. The end of the fifth touch sensing line part RL5 disposed on the second source-drain conductive layer may be connected to the fourth touch sensor line part RL4 through the contact hole CNT6 penetrating the second gate insulating layer 113 and the interlayer dielectric layer 114. The third touch sensing line part RL3 may be connected to the fifth touch sensing line part RL5 through a contact hole CNT7 penetrating the first via layer 115.

According to this modification, by using the fourth touch sensing line part RL4 of the gate conductive layer to connect the second touch sensing line part RL2 with the third touch sensing line part RL3 in the non-active area AAR, it is possible to achieve a larger area where the lines of the second source-drain conductive layer can be disposed. In addition, by using the fifth touch sensing line part RL5 located on the second source-drain conductive layer to connect the fourth touch sensing line part RL4 with the third touch sensing line part RL3, it is possible to reduce the process time consumed to form contact holes.

Figure 17:
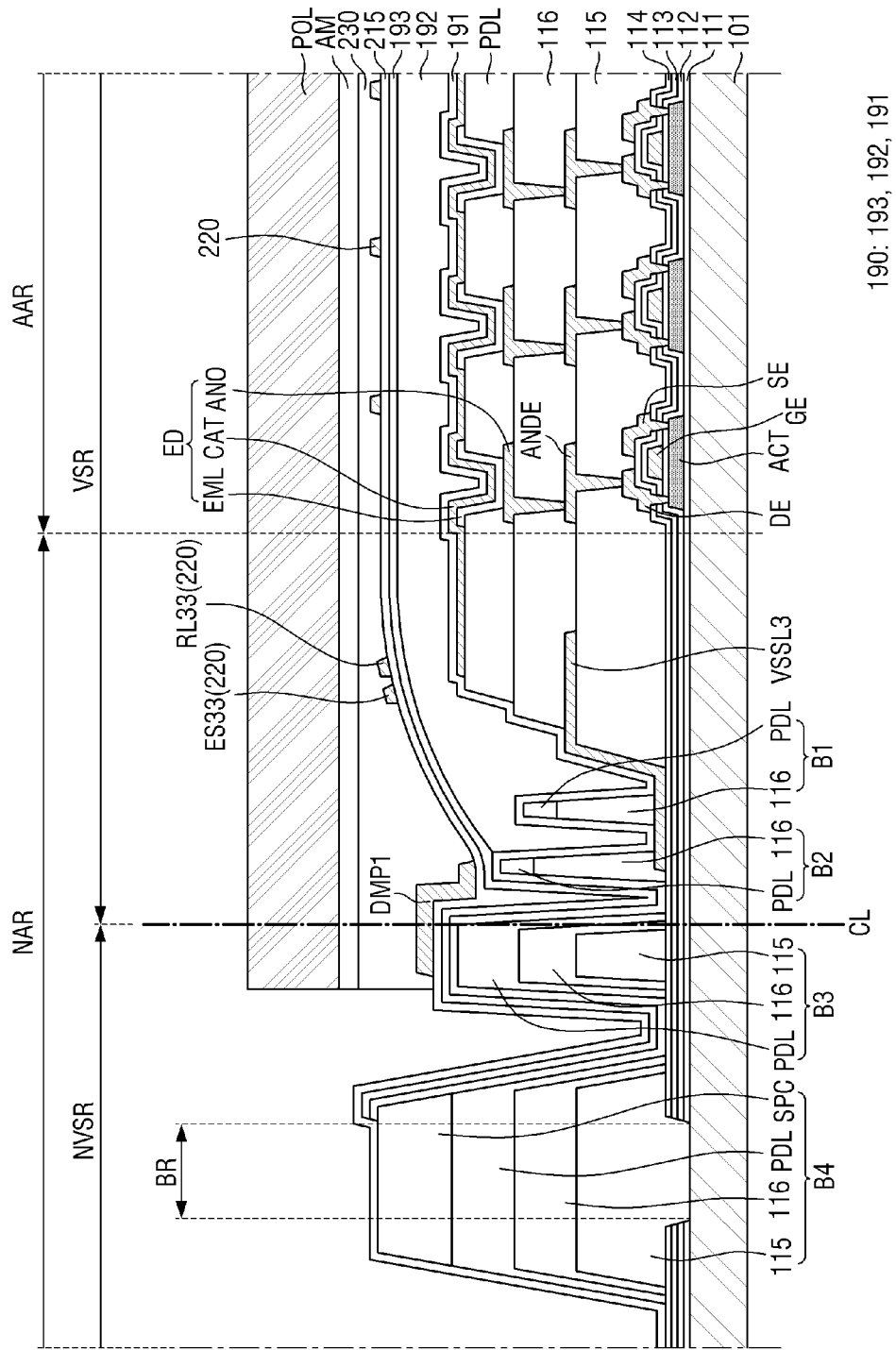
FIG. 17 is a cross-sectional view taken along line VI-VI' of FIG. 13.

FIG. 17 is a cross-sectional view taken along line VI-VI' of FIG. 13. FIG. 18 is a cross-sectional view showing a visible region distinguished from a non-visible region according to an embodiment.

Referring to FIG. 17, the display panel may include a substrate 101, a buffer layer 111 on the substrate 101, a semiconductor layer ACT on the buffer layer 111, a first gate insulating layer 112 on the semiconductor layer ACT, the first gate conductive layer on the first gate insulating layer 112, the second gate insulating layer 113 on the first gate conductive layer, an interlayer dielectric layer 114 on the second gate insulating layer 113, a first source-drain conductive layer on the interlayer dielectric layer 114, a first via layer 115 on the first source-drain conductive layer, a second source-drain conductive layer on the first via layer 115, a second via layer 116 on the second source-drain conductive layer 116, an anode electrode ANO on the second via layer 116, a bank layer PDL on anode electrode ANO, an emissive layer on bank layer PDL (including organic layer EML), a cathode electrode CAT on the emissive layer, an thin-film encapsulation layer 190 on the cathode electrode CAT, a first touch insulating layer 215 on the thin-film encapsulation layer 190, a second touch conductive layer 220 on the first touch insulating layer 215, a second touch insulating layer 230 on the second touch conductive layer 220, a polarization layer POL on the second touch insulating layer 230, and a coupling member AM attaching the polarization layer POL to the second touch insulating layer 230.

The buffer layer 111 may be disposed on the substrate 101. The buffer layer 111 may include an inorganic material. Examples of the inorganic material include silicon nitride, silicon oxide, silicon oxynitride, or the like. Although the buffer layer 111 is implemented as a single layer in the example shown in FIG. 17, the buffer layer 111 may be implemented as a stack of layers.

The semiconductor layer ACT may be disposed on the buffer layer 111. The semiconductor layer ACT may be disposed in the active area AAR. In some embodiments, the semiconductor layer ACT may form a driving circuit disposed in the non-active area NAR.

The first gate insulating layer 112 may be disposed on the semiconductor layer ACT. The first gate insulating layer 112 may cover the semiconductor layer ACT. The first gate insulating layer 112 may include an inorganic material. Examples of the inorganic material include silicon nitride, silicon oxide, silicon oxynitride, or the like.

A gate conductive layer may be disposed on the first gate insulating layer 112. The gate conductive layer may include a thin-film transistor, a gate electrode GE of a driving circuit, and fan-out line parts D_FL1 and D_FL3 of the data fan-out line D_FL of FIG. 13. The semiconductor layer ACT may include a channel region overlapping the gate electrode GE.

The gate conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The gate conductive layer may be made up of a single layer of the above-listed materials. It is, however, to be understood that the embodiments described herein are not limited thereto. The gate conductive layer may be a stack of multiple layers.

The second gate insulating layer 113 may be disposed on the gate conductive layer. The second gate insulating layer 113 can insulate the gate electrode GE from a source electrode SE and a drain electrode DE, which will be described later. Furthermore, at least one of the above-listed materials of the first gate insulating layer 112 may be selected as the second gate insulating layer 113.

Although not shown in the drawings, a second gate conductive layer may be further disposed on the second gate insulating layer 113. The second gate conductive layer may include one of capacitor electrodes of the organic light-emitting element.

The interlayer dielectric layer 114 may be disposed on the second gate insulating layer 113. At least one of the above-listed materials of the first gate insulating layer 112 may be selected as the interlayer dielectric layer 114.

The first source-drain conductive layer may be disposed on the interlayer dielectric layer 114. The first source-drain conductive layer may include the source electrode SE and the drain electrode DE of the thin-film transistor. The source electrode SE and the drain electrode DE may be electrically connected to the semiconductor layer ACT through contact holes penetrating the interlayer dielectric layer 114 and the gate insulating layers 113 and 112, respectively.

The first source/drain electrode conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first source-drain conductive layer may be made up of a single layer made of the above-listed materials. It is, however, to be understood that the embodiments described herein are not limited thereto. The first source-drain conductive layer may be a stack of layers.

The first via layer 115 may be disposed over the first source-drain conductive layer. The first via layer 115 may be disposed in the active area AAR and a part of the non-active area NAR. The first via layer 115 disposed in the bending region BR may be in direct contact with the substrate 101. In other words, the interlayer dielectric layer 114, the gate insulating layers 113 and 112, and the buffer layer 111 may be removed in the bending region BR to expose the upper surface of the substrate 101. The first via layer 115 may be in direct contact with the exposed upper surface of the substrate 101. The first via layer 115 may form a third block pattern B3 and a fourth block pattern B4. The first via layer 115 of the third and fourth block patterns B3 and B4 may be located in the non-visible region NVSR. The fourth block pattern B4 may be disposed to overlap the bending region BR.

The first via layer VIA1 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The second source-drain conductive layer may be disposed on the first via layer 115. The second source-drain conductive layer may include an anode connection electrode ANDE connected to the drain electrode DE through a contact hole penetrating the first via layer 115, a first supply voltage signal line VSSL, a second supply voltage signal line VDDL, a second fan-out line part D_FL2 of the data fan-out line D_FL, and a second line part of the touch signal lines.

As shown in FIG. 17, one end of the third supply voltage signal line part VSSL3 of the first supply voltage signal line VSSL may be located on the upper surface of the first via layer 115, and the other end thereof may be located on the upper surface of the interlayer dielectric layer 114 that is exposed by the first via layer 115. The other end of the third supply voltage signal line part VSSL3 is located in the visible region VSR and is spaced apart from the boundary line CL between the visible region VSR and the non-visible region NVSR by a predetermined distance.

The second source/drain electrode conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second source-drain conductive layer may be made up of a single layer made of the above-listed materials. It is, however, to be understood that the embodiments described herein not limited thereto. The second source-drain conductive layer may be a stack of layers. According to an embodiment, the constituent material of the second source-drain conductive layer may be more flexible than the constituent material of the gate conductive layer and the constituent material of the touch conductive layers 210 and 220 in FIG. 10.

The second via layer 116 may be disposed over the second source-drain conductive layer. The second via layer 116 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The second via layer 116 may be disposed in the active area AAR and a part of the non-active area NAR. The second via layer 116 may form the block patterns B1 to B4. The second via layer 116 of the first block pattern B1 may be in direct contact with the upper surface of the third supply voltage signal line part VSSL3 disposed on the upper surface of the interlayer dielectric layer 114 exposed by the first via layer 115. The second via layer 116 of the second block pattern B2 may be in direct contact with the upper and side surfaces of the other end of the third supply voltage signal line part VSSL3. The second via layer 116 of the third block pattern B3 may have a larger width than the first via layer 115 of the third block pattern B3 and may be in direct contact with the upper and side surfaces of the first via layer 115. The second via layer 116 of the third block pattern B3 may be disposed to overlap the boundary line CL in the thickness direction. The second via layer 116 of the fourth block pattern B4 may have a width than the first via layer 115 of the fourth block pattern B4 and may be in direct contact with the upper and side surfaces of the first via layer 115.

The anode electrode ANO may be disposed on the second via layer 116. The anode electrode ANO may be a pixel electrode disposed in each of the pixels. The anode electrode ANO may be connected to the anode connection electrode ANDE through a contact hole penetrating the second via layer 116.

The anode electrode ANO may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or a mixture thereof. A layer having a higher work function may be disposed on a reflective material layer so that it is disposed closer to the emissive layer 175. The anode electrode ANO may have, but is not limited to, a multilayer structure of ITO/Mg, ITO/MgF, ITO/Ag, and ITO/Ag/ITO.

The bank layer PDL may be disposed on the anode electrode ANO. The bank layer PDL may be disposed over the anode electrode ANO and may include an opening exposing the anode electrode ANO. The emission area and the non-emission area may be separated by the bank layer PDL and the openings thereof.

The bank layer PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB). The bank layer PDL may include an inorganic material.

The bank layer PDL may form the block patterns B1 to B4. The bank layer PDL of the first to fourth block patterns B1 to B4 may be disposed to overlap with the second via layer 116 of the block patterns B1 to B4. Although width of the lower surface of the bank layer PDL in the first and second block patterns B1 and B2 is equal to the width of the upper surface of the second via layer 116 of the block patterns B1 and B2 in the example shown in FIG. 17, the embodiments described herein are not limited thereto. The width of the lower surface of the bank layer PDL may be greater than the width of the upper surface of the second via layer 116 of the block patterns B1 and B2, and the bank layer PDL may be in direct contact with the side surface of the second via layer 116 of the block patterns B1 and B2. The width of the lower surface of the bank layer PDL in the third and fourth block patterns B3 and B4 may be greater than the width of the upper surface of the second via layer 116 of the block patterns B3 and B4. The bank layer PDL may be in direct contact with the side surfaces of the second via layer 116 of the block patterns B3 and B4.

A spacer SPC may be disposed on the bank layer PDL. The spacer SPC may be disposed on the bank layer PDL forming the fourth block pattern B4 to form the fourth block pattern B4. The spacer SPC may overlap the bank layer PDL in the bending region BR. In the fourth block pattern B4, the width of the lower surface of the spacer SPC may be equal to the width of the upper surface of the bank layer PDL of the block pattern B4. It is, however, to be understood that the embodiments described herein are not limited thereto. The width of the lower surface of the spacer SPC may be greater than the width of the upper surface of the bank layer PDL of the block pattern B4 and may be in direct contact with the side surfaces of the bank layer PDL.

The surface height of the block patterns B1 to B4 may increase toward the fourth block pattern B4 from the first block pattern B1. It is, however, to be understood that the embodiments described herein are not limited thereto. The surface height of each of the black patterns B1 to B4 may be designed in a variety of ways depending on processes and functions.

More specifically, the fourth block pattern B4 supports a mask used to form the thin-film encapsulation layer 190 and the patterns of the touch conductive layers 210 and 220 above the fourth block pattern B4, and thus the surface height of the fourth block pattern B4 may be greater than the surface height of the other block patterns B1 to B3. The surface height of the bank layer PDL of the fourth block pattern B4 is equal to the surface height of the third block pattern B3, but the surface height of the fourth block pattern B4 may be increased by the spacer SPC and thus may be greater than the surface height of the third block pattern B3.

The first block pattern B1 to the third block pattern B3 can work as dams for prevent that the organic layer 192 of the thin-film encapsulation layer 190 intrudes the block patterns B1 to B3 and reflows to the end of the non-active area NAR. Accordingly, the surface heights of the first to third block patterns B1 to B3 sequentially arranged along the direction in which the organic layer 192 reflows may increase away from the active area AAR. Typically, the elements 116 and PDL of the block patterns B1 to B3 are formed via an organic material deposition process, exposure and development processes using the same mask. Accordingly, the elements 116 and PDL of the adjacent block patterns B1 to B3 may have the same height. In order to create differences in the surface height among the first block pattern B1 to the third block pattern B3, the elements 116 and PDL of the block patterns B1 to B3 may be formed by using a halftone mask or a slit mask, by which the amount of light can be adjusted for different regions. In this manner, as shown in FIG. 17, the surface height of the second via layer 116 can be increased from the first block pattern B1 to the third block pattern B3. Likewise the surface height of the bank layer PDL may also be increased from the first block pattern B1 to the third block pattern B3.

In the example shown in FIG. 17, the fourth block pattern B4 supporting a mask and the first to third block patterns B1 to B3 working as dams are depicted. However, one or two of the first to third block patterns B1 to B3 may be eliminated to reduce the width of the non-active area NAR (the width in first direction DR1 of FIG. 1). Further, the stack structure of the block patterns B1 to B4 is not limited to that shown in FIG. 17, but various design changes may be made as long as a mask can be supported and/or reflow of the organic layer can be prevented.

Referring back to FIG. 17, the emissive layer is disposed on the anode electrode ANO exposed via the bank layer PDL. The emissive layer may include the organic layer EML. The organic layer EML may further include a hole injecting/transporting layer and/or an electron injecting/transporting layer.

The cathode electrode CAT may be disposed on the emissive layer. The cathode electrode CAT may be a common electrode disposed across the pixels. The anode electrode ANO, the emissive layer and the cathode electrode CAT may form an organic light-emitting diode ED.

The cathode electrode CAT may be in contact with the emissive layer as well as the upper surface of the bank layer PDL. The cathode electrode CAT may be formed conformally to the underlying elements to reflect the step difference of the underlying elements.

The cathode electrode CAT may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode CAT may further include a transparent metal oxide layer disposed on the material layer having a small work function.

An thin encapsulation layer 190 including a first inorganic layer 191, an organic layer 192 and a second inorganic layer 193 is disposed on the cathode electrode CAT. Each of the first inorganic film 191 and the second inorganic film 193 may include silicon nitride, silicon oxide, silicon oxynitride, or the like. The organic layer 192 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

The first inorganic layer 191 may be extended and disposed in the active area AAR and a part of the non-active area NAR. The end of the first inorganic layer 191 may be disposed on the upper surface of the fourth block pattern B4.

The organic layer 192 may be disposed across the active area AAR and may be disposed on the inner side of at least one of the block patterns B1 to B4. For example, the organic layer 192 may be disposed on the inner side of the second to fourth block patterns B2 to B4 and may be disposed on the outer side of the first block pattern B1 as well. The organic layer 192 may cover the side surface of the second block pattern B2 that faces the active area AAR, the upper surface of the first block pattern B1, and the inner side surface of the first block pattern B1 that faces the active area AAR.

The second inorganic layer 193 may be disposed on the organic layer 192 and the first inorganic layer 191. The second inorganic layer 193 may be extended and disposed in the active area AAR and a part of the non-active area NAR. The end of the second inorganic layer 193 may be disposed on the upper surface of the fourth block pattern B4. According to an embodiment, the organic layer 192 is terminated at the side surface of the second block pattern B2, and thus the second inorganic layer 193 may be in direct contact with the first inorganic layer 191 from the upper surface to the outer side of the second block pattern B2.

A first touch insulating layer 215 may be disposed on the second inorganic layer 193. The first touch insulating layer 215 may be in direct contact with the upper surface of the fourth block pattern B4 exposed by the inorganic layers 191 and 193.

A second touch conductive layer 220 may be disposed on the first touch insulating layer 215. The second touch conductive layer 220 may be disposed in the active area AAR and the non-active area NAR. FIG. 17 shows an example of a third touch antistatic line part ES33 and a third touch sensing line part RL33 disposed in the non-active area NAR. The second touch conductive layer 220 may include a first dummy pattern DMP1 overlapping the boundary line CL in the thickness direction. As shown in FIG. 17, the first dummy pattern DMP1 overlaps a part of the third supply voltage signal line part VSSL3 and the boundary line CL in thickness direction, so that it can cover the first line-free area from the boundary line CL to the third supply voltage signal line part VSSL3. By doing so, it is possible to prevent that black color is sensed differently between the first line-free area and the area around it where lines are disposed.

A second touch insulating layer 230 may be disposed on the second touch conductive layer 220. The second touch insulating layer 230 may be in direct contact with the second touch conductive layer 220. Although the second touch insulating layer 230 is disposed in the visible region VSR and a part of the non-visible region NVSR in the example shown in FIG. 17, the embodiments described herein are not limited thereto. The second touch insulating layer 230 may be disposed in substantially the entire non-visible region NVSR.

A polarization layer POL may be disposed on the second touch insulating layer 230. The polarization layer POL may be coupled to the second touch insulating layer 230 by a coupling member AM. The coupling member AM may be an optically clear adhesive, etc. As shown in FIG. 17, the polarization layer POL may be disposed in the visible region VSR and a part of the non-visible region NVSR that is adjacent to the visible region VSR. The end of the polarization layer POL may be disposed to overlap with the third block pattern B3 in the thickness direction, but the position of the end of the polarization layer POL is not limited thereto. The polarization layer POL may be disposed to overlap the boundary line CL in the thickness direction.

A protective layer WDL and a black matrix BM disposed on the surface of the protective layer WDL that faces the substrate 101 may be further disposed above the polarization layer POL. The end of the black matrix BM may be closer to the active area AAR than the end of the polarization layer POL is. The end of the black matrix BM may be located in the visible region VSR, and the black matrix BM may be disposed to overlap the boundary line CL in the thickness direction. Some of the external lights LO1, LO2 and LO3 incident on the protective layer WDL from the outside may be absorbed by the black matrix BM (LO1) or may be absorbed by the polarization layer POL (LO2). At least one of the external lights LO3 not absorbed by the black matrix BM or the polarization layer POL may pass through the polarization layer POL, the coupling member AM and the second touch insulating layer 230 and may be reflected off the first dummy pattern DMP1. Then, it may pass through the second touch insulating layer 230, the coupling member AM, the polarization layer POL, the end of the black matrix BM and the protective layer WDL, and it may be recognized by a user (hereinafter referred to as first metal reflected light L1). Although not shown in the drawings, another one of the external lights LO3 not absorbed by the black matrix BM or the polarization layer POL may pass through the polarization layer POL, the coupling member AM, the second touch insulating layer 230, the thin-film encapsulation layer 190, etc., and may be reflected off the third supply voltage signal line part VSSL3, so that it may be recognized by a user (hereinafter referred to as second metal reflected light). Since the first metal reflected light and the second metal reflected light are reflected off the conductive layers above the source-drain conductive layer, there may be a smaller difference in visual sensation in black. The first dummy pattern DMP1 disposed in the first line-free area overlaps the boundary line CL and at least a part of the third supply voltage signal line part VSSL3 of the first supply voltage signal line VSSL. Accordingly, it is possible to prevent that black color is recognized differently in the visible region VSR between the first line-free area and the area where the signal lines of the adjacent source-drain conductive layers and the touch conductive layers are disposed.

Figure 19A:
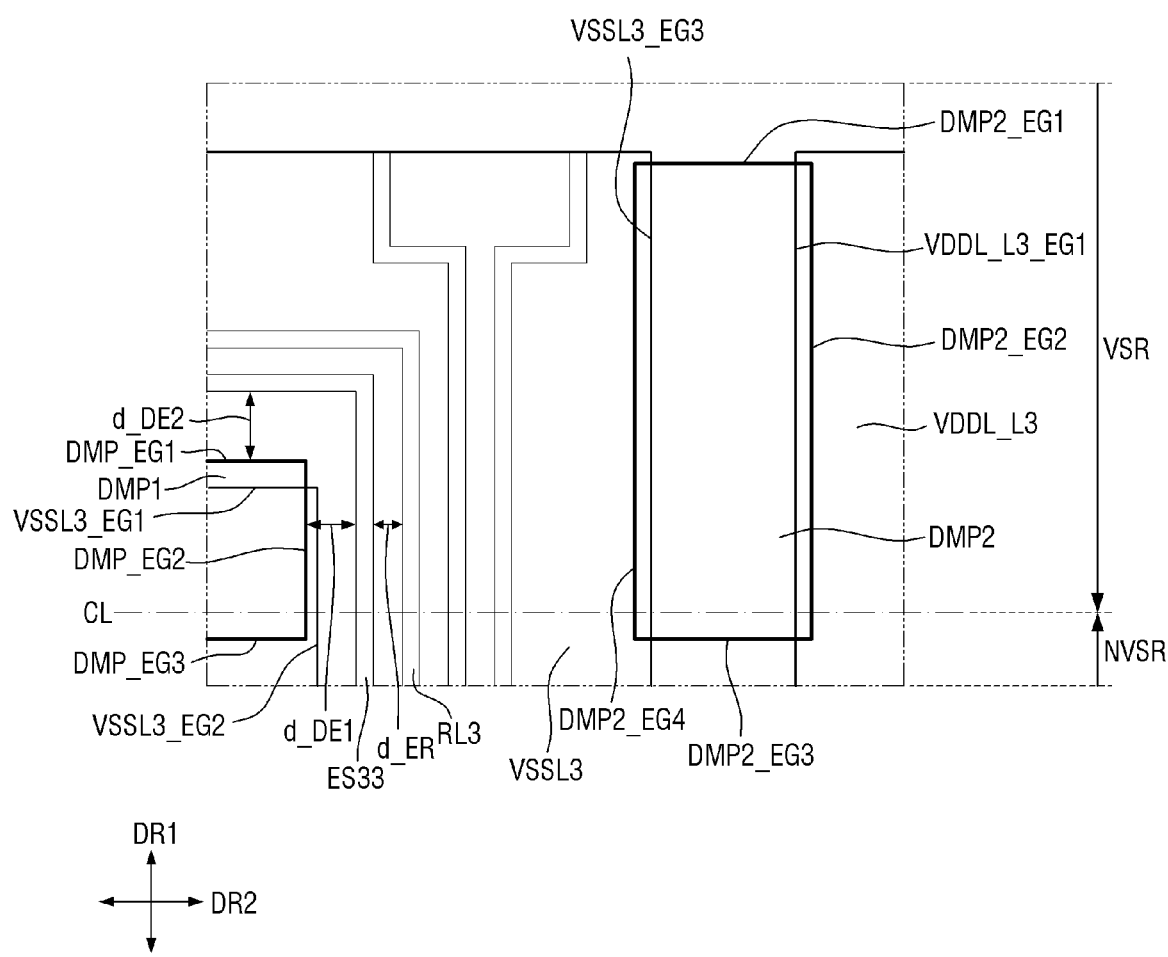
FIG. 19A is an enlarged plan view of the periphery of the first and second dummy patterns of FIG. 13.

FIG. 19A is an enlarged plan view of the periphery of the first and second dummy patterns of FIG. 13.

Referring to FIGS. 13 and 19A, adjacent touch signal lines may be spaced apart from one another with a predetermined separation distance d_ER. For example, the third touch antistatic line part ES33 and the third touch sensing line part RL3 may be spaced apart from each other in the second direction DR2 with a predetermined separation distance d_ES.

The edge VSSL3_EG2 of the third supply voltage signal line part VSSL3 may be located closer to the second dummy pattern DMP2 than the edge DMP_EG2 of the first dummy pattern DMP1 is. For example, the edge VSSL3_EG2 of the third supply voltage signal line part VSSL3 may be extended in the first direction DR1 in parallel with the edge DMP_EG2 of the first dummy layer pattern DMP1 and may face each other. One end of the edge DMP_EG2 of the first dummy pattern DMP1 may cross the edge VSSL3_EG1 of the third supply voltage signal line part VSSL3 and may be extended to overlap the third supply voltage signal line part VSSL3. The other end of the edge DMP_EG2 of the first dummy pattern DMP1 may pass through the boundary line CL and may be located in the non-visible region NVSR. The edge DMP_EG3 of the first dummy pattern DMP1 may be located in the non-visible region NVSR.

The edge DMP_EG1 of the first dummy pattern DMP1 may be disposed to overlap the third supply voltage signal line part VSSL3, and may be located closer to the active area AAR than the edge VSSL3_EG1 of the third supply voltage signal line part VSSL3 is.

The edge DMP_EG2 of the first dummy pattern DMP1 may be spaced apart from a part of the third antistatic line part ES33 extended in the first direction DR1 among adjacent touch signal lines with a predetermined separation distance d_DE1 in the second direction DR2. The edge DMP_EG1 of the first dummy pattern DMP1 may be spaced apart from a part of the third antistatic line part ES33 extended in the second direction DR2 among adjacent touch signal lines with a predetermined separation distance d_DE2 in the first direction DR1.

The edges DMP_EG1 and DMP_EG2 of the first dummy pattern DMP1 may be spaced apart from the adjacent third antistatic line part ES33 with predetermined separation distance d_DE1 and d_DE2, respectively, which are greater than the minimum separation distance. The minimum separation distance may refer to the separation distance d_ER between the third touch antistatic line part ES33 and the third touch sensing line part RL3 in the second direction DR2.

The edge DMP2_EG3 of the second dummy pattern DMP2 that is opposed to the edge DMP2_EG1 may be located in the non-visible area NVSR. The edges DMP2_EG2 and DMP2_EG4 may overlap the adjacent third supply voltage signal line part VDDL_L3 and the third supply voltage signal line part VSSL3. That is to say, the edge DMP2_EG1 of the second dummy pattern DMP2 may be located farther from the first dummy pattern DMP1 than the edge VDDL_L3_EG1 of the third supply voltage signal line part VDDL_L3 is. The edge DMP2_EG4 of the second dummy pattern DMP2 may be located closer to the first dummy pattern DMP1 than the edge VSSL3_EG3 of the third supply voltage signal line part VSSL3 is. The area of the first dummy pattern DMP1 may be changed in a variety of ways.

Figure 19B:
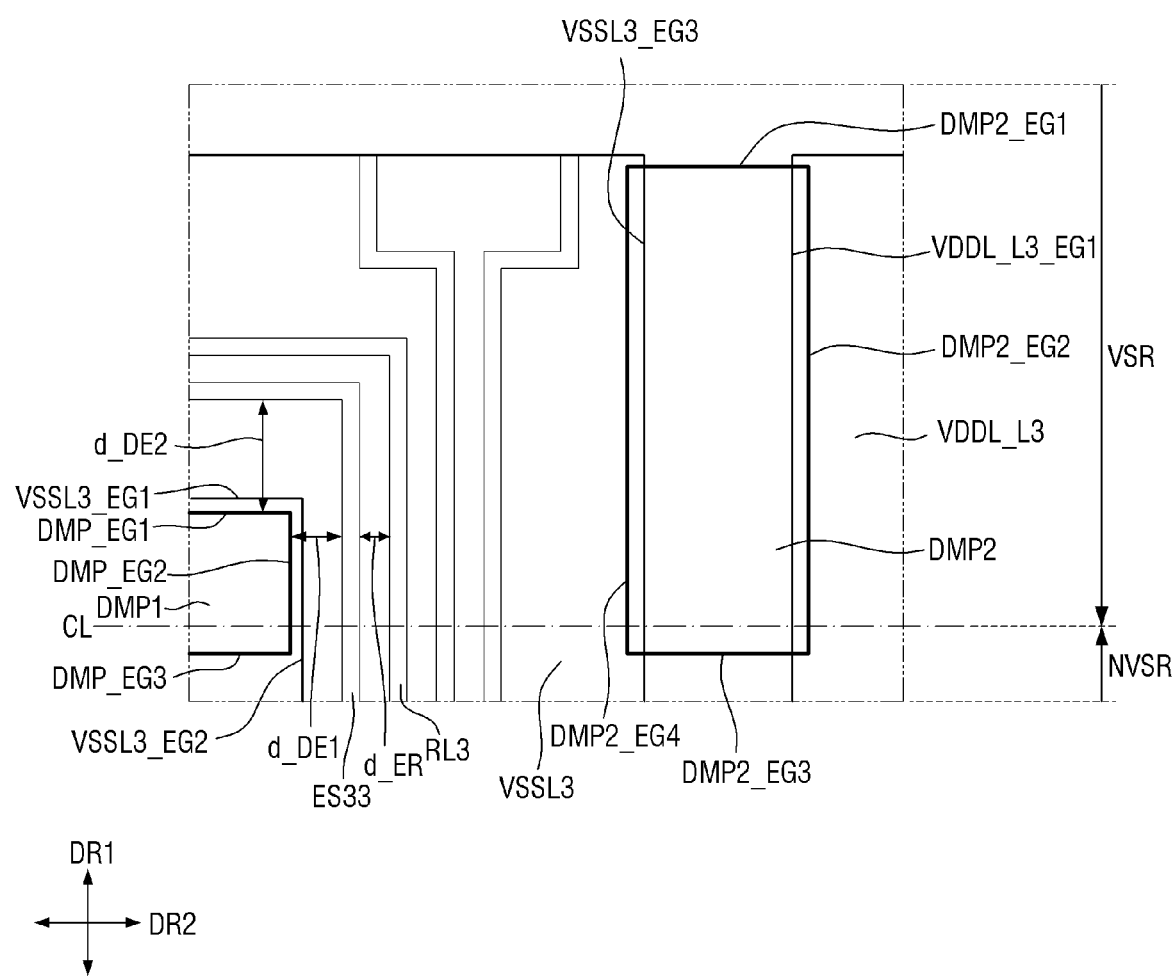
FIG. 19B is a plan view showing a modification of the example of FIG. 19A.

FIG. 19B is a plan view showing a modification of the example of FIG. 19A.

As shown in FIG. 19B, the edge DMP_EG1 of the first dummy pattern DMP1 may not overlap the third supply voltage signal line part VSSL3 and may be located farther from the active area AAR. A separation distance d_DE2 between the edge DMP_EG1 of the first dummy pattern DMP1 and a part of the third antistatic line part ES33 extended in the second direction DR2 among the adjacent touch signal lines may be larger than the separation distance d_DE2 of FIG. 19A. According to this modification, when the touch signal line is located close to the edge DMP_EG1 of the first dummy pattern DMP1, the edge DMP_EG1 of the first dummy pattern DMP1 is modified to be located farther from the active area AAR, so that it is possible to prevent a short circuit between the touch signal line and the first dummy pattern DMP1.

Figure 19C:
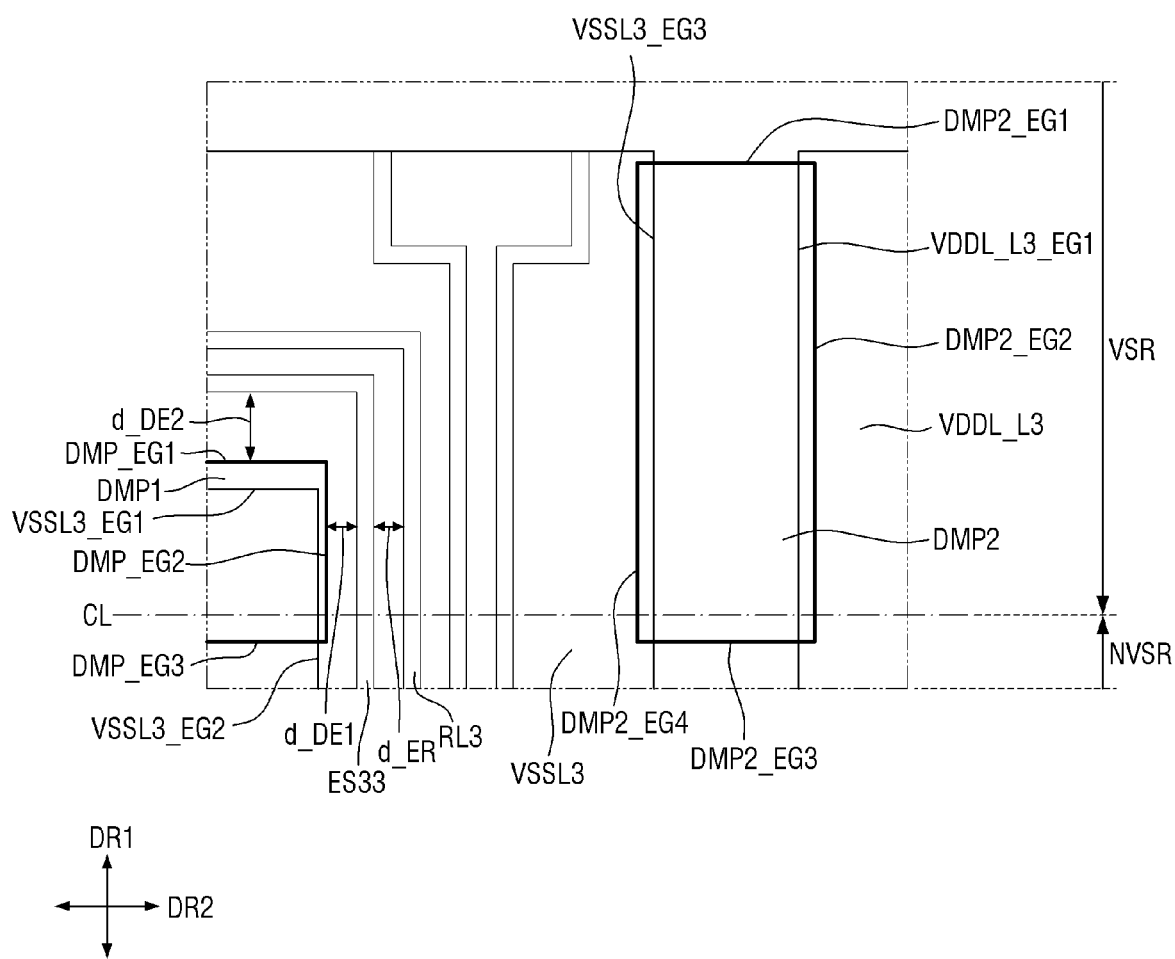
FIG. 19C is a plan view showing a modification of the example of FIG. 19A.

FIG. 19C is a plan view showing a modification of the example of FIG. 19A.

As shown in FIG. 19C, the edge VSSL3_EG2 of the third supply voltage signal line part VSSL3 may be located farther from the second dummy pattern DMP2 than the edge DMP_EG2 of the first dummy pattern DMP1 is. The first dummy pattern DMP1 may overlap a part of the third supply voltage signal line part VSSL3.

Hereinafter, other embodiments will be described. In the following description, the same or similar elements will be denoted by the same or similar reference numerals, and redundant descriptions will be omitted or briefly described.

Hereinafter, other embodiments of at least one of the dummy patterns DMP1 to DMP3 described above in FIG. 13 will be described with reference to FIGS. 20 to 26. Although at least one of the dummy patterns DMP1 to DMP3 will be described with reference to FIGS. 20 to 26, the description can be equally applied to the other dummy patterns DMP1 to DMP3 which are not described unless specifically required to distinguish one from another.

According to the embodiments shown in FIGS. 20 to 23, the dummy patterns DMP1 to DMP3 may have a variety of patterns rather than a planar shape.

Figure 20:
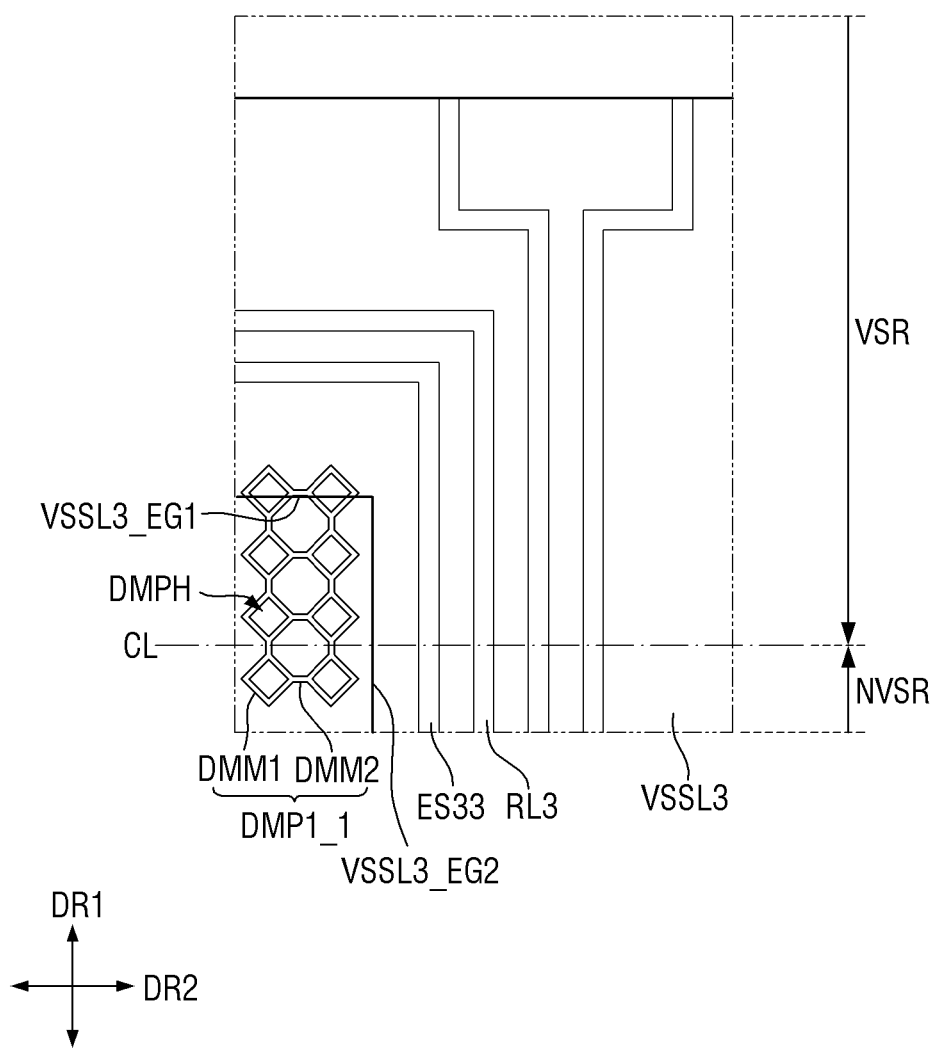
FIG. 20 is an enlarged plan view of the periphery of a first dummy pattern according to another embodiment.

FIG. 20 is an enlarged plan view of the periphery of a first dummy pattern according to another embodiment.

A first dummy pattern DMP1_1 according to the embodiment of FIG. 20 is different from the first dummy pattern DMP1 according to the embodiment of FIG. 13 in that the former is formed in a mesh pattern having a plurality of mesh holes DMPH.

Although the mesh holes DMPH according to this embodiment have a diamond shape, the shape of the mesh holes DMPH when viewed from the top is not limited thereto. The mesh holes DMPH may have a circular shape like that shown in FIG. 21, a polygonal shape such as a quadrangular shape and a triangular shape, or an elliptical shape.

When the mesh holes DMPH have a diamond shape when viewed from the top, a main mesh pattern DMM1 surrounding the mesh hole DMPH may have a diamond lattice shape. The main mesh pattern DMM1 and the mesh hole DMPH may form a single group. There may be more than one groups, which may be arranged in the first direction DR1 and the second direction DR2 as shown in FIG. 20. Adjacent groups may be connected by a subsidiary mesh pattern DMM2 that physically connects the adjacent main mesh patterns DMM1. The width of the subsidiary mesh pattern DMM2 may be equal to the width of the main mesh pattern DMM1. It is, however, to be understood that the embodiments described herein are not limited thereto. The width of the main mesh pattern DMM1 may be equal to the width of adjacent touch signal lines. It is, however, to be understood that the embodiments described herein are not limited thereto. The width of the main mesh pattern DMM1 may be smaller than the width of adjacent touch signal lines.

Figure 21:
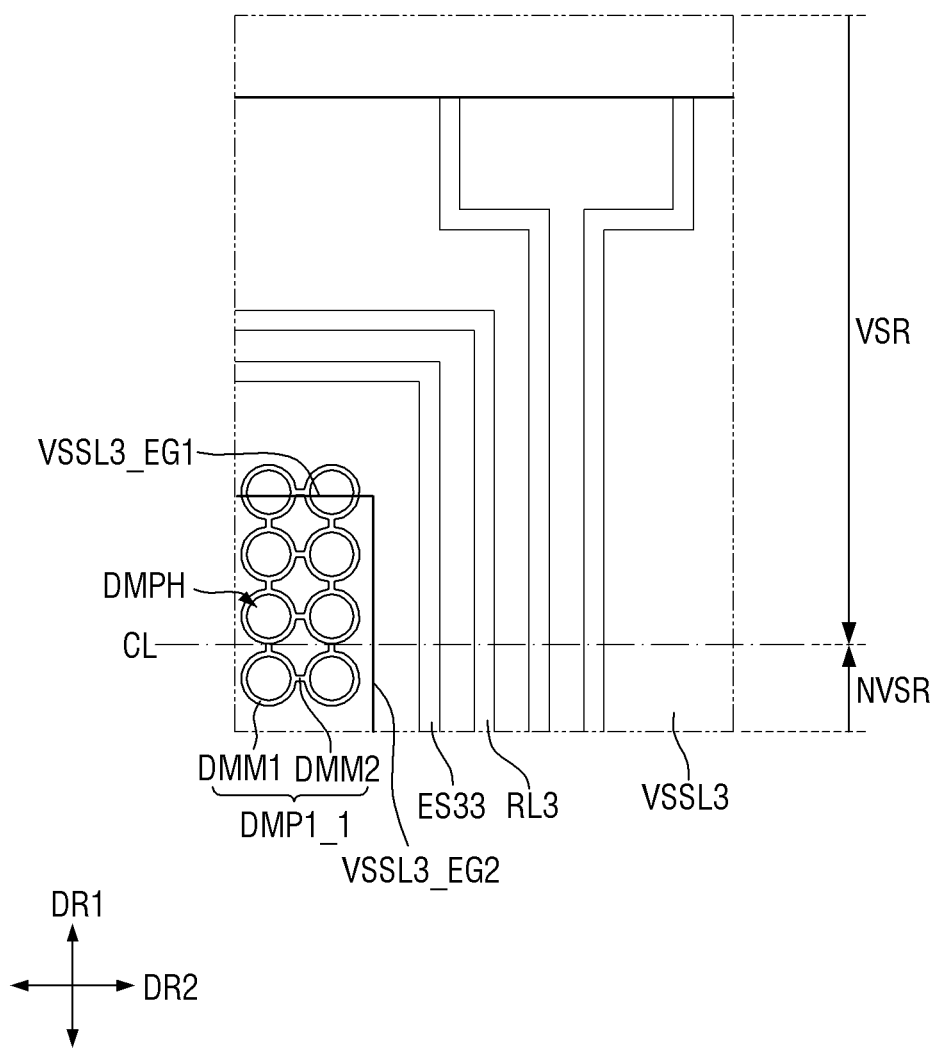
FIG. 21 is an enlarged plan view of the periphery of a first dummy pattern according to yet another embodiment.

FIG. 21 is an enlarged plan view of the periphery of a first dummy pattern according to yet another embodiment.

A first dummy pattern DMP1_1 according to the embodiment of FIG. 21 is different from the first dummy pattern DMP1_1 according to the embodiment of FIG. 20 in that the former is formed in a mesh pattern having a plurality of mesh holes DMPH, that the mesh holes DMPH have a circular shape when viewed from the top, and that a main mesh pattern DMM1 surrounding the mesh hole DMPH has a circular lattice shape.

Figure 22:
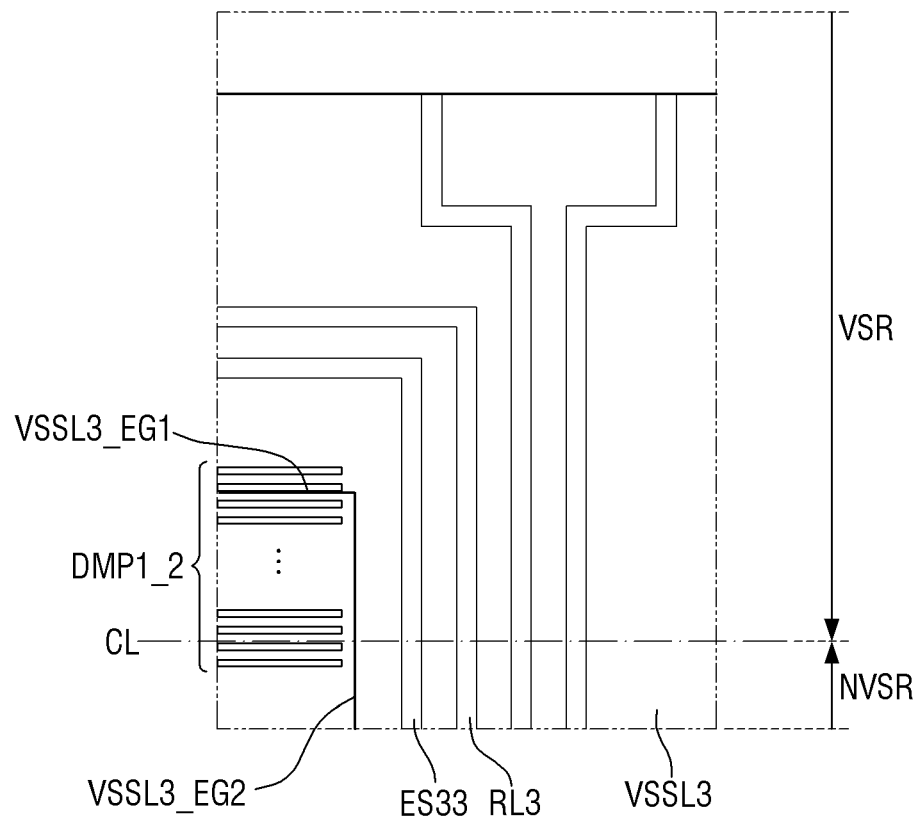
FIG. 22 is an enlarged plan view of the periphery of a first dummy pattern according to yet another embodiment.

FIG. 22 is an enlarged plan view of the periphery of a first dummy pattern according to yet another embodiment.

A first dummy pattern DMP1_2 according to the embodiment of FIG. 22 is different from the first dummy pattern DMP1 according to the embodiment of FIG. 13 in that the former is formed in a plurality of line patterns.

More specifically, the line patterns of the first dummy pattern DMP1_2 according to this embodiment may be extended in the second direction DR2. The plurality of line patterns may be arranged along the first direction DR1.

Figure 23:
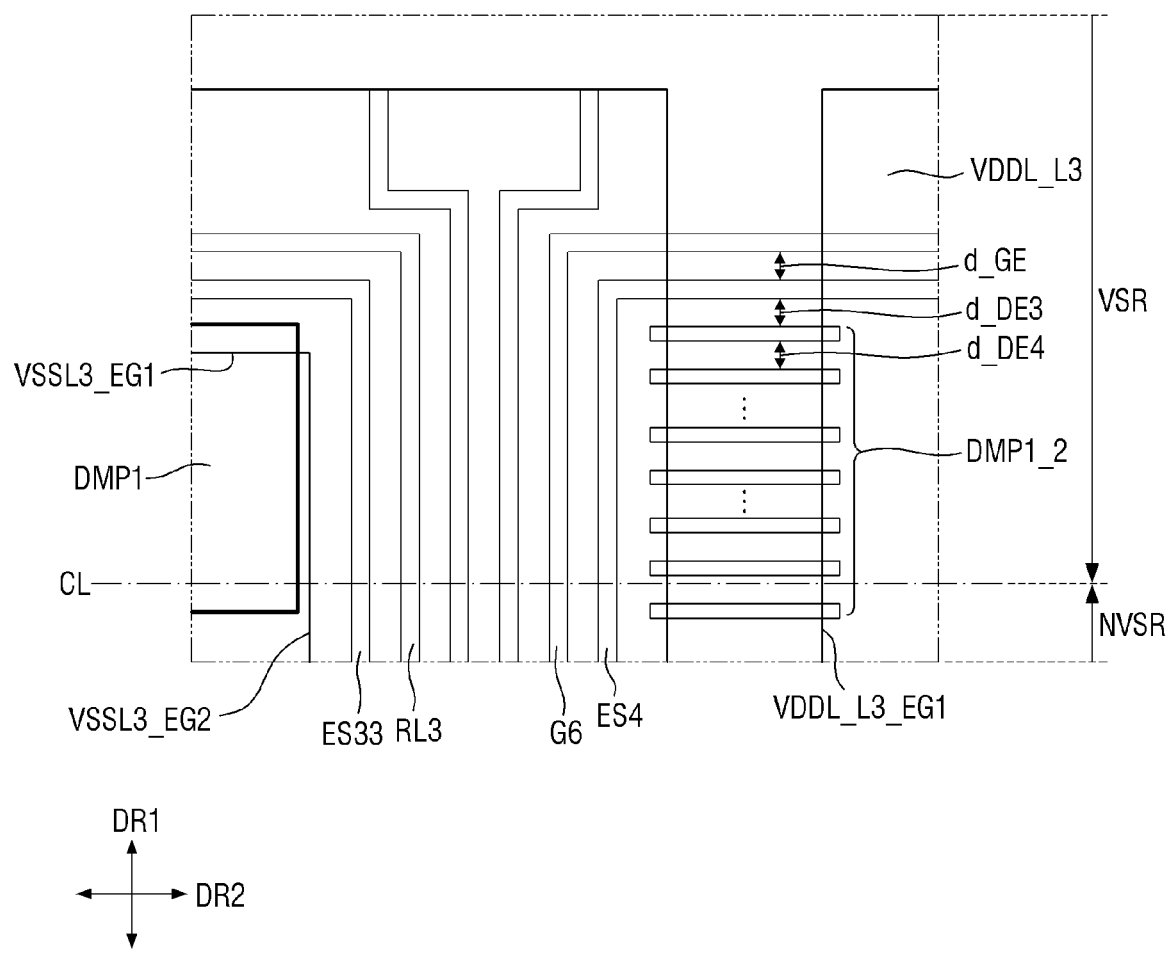
FIG. 23 is an enlarged plan view of the periphery of a first dummy pattern and a second dummy pattern according to yet another embodiment.

FIG. 23 is an enlarged plan view of the periphery of a first dummy pattern and a second dummy pattern according to yet another embodiment.

The arrangement of touch signal lines according to the embodiment of FIG. 23 is different from the arrangement of the touch signal lines shown in FIG. 13 in that at least one of the touch signal lines is further disposed in a second line-free area. More specifically, among the touch signal lines, a sixth touch ground line G6 and a fourth touch antistatic line ES4 may pass through a first line-free area, as shown in FIG. 23.

A second dummy pattern DMP2_2 disposed in the second line-free area may be formed of a plurality of line patterns, like the first dummy pattern DMP1_2 of FIG. 22. The plurality of line patterns of the second dummy pattern DMP2_2 may be extended along the second direction DR2 and may be spaced apart from each other along the first direction DR1 with a predetermined separation distance d_DE4.

The fourth touch antistatic line ES4 and the sixth touch ground line G6 may be spaced apart from each other in the first direction DR1 with a predetermined separation distance d_GE. The separation distance d_GE between the fourth touch antistatic line ES4 and the sixth touch ground line G6 may be equal to the separation distance d_ER between the third touch sensing line part RL3 and the third touch antistatic line part ES33. The separation distance d_DE3 between the line patterns of the adjacent second dummy pattern DMP2_2 and the fourth touch antistatic line ES4 may be equal to the separation distance d_GE between the fourth touch antistatic line ES4 and the sixth touch ground line G6 and to the separation distance d_DE4 among the plurality of line patterns. According to this embodiment, the separation distance d_DE4 of the line patterns of the second dummy pattern DMP2_2, the separation distance d_DE3 between the line patterns and the adjacent touch signal lines, and the separation distance d_GE between the adjacent touch signal lines are all equal. Accordingly, it is possible to prevent a difference in black color between the second line-free area and the area around it when the lines are disposed. One ends (one ends on the first side of the second direction DR2) of the line patterns are located closer to the first side of the second direction DR2 than the edge VDDL_L3_EG1 of the third supply voltage signal line part VDDL_L3, and the other ends (the other ends on the second side of the second direction DR2) thereof are located closer to the second side of the second direction DR2 than the adjacent edge of the third supply voltage signal line part VSSL3. Accordingly, the line patterns may overlap the third supply voltage signal line part VDDL_L3 and the third supply voltage signal line part VSSL3.

Hereinafter, an example will be described with reference to FIGS. 24 to 26, where constant voltage is applied to dummy patterns.

Figure 24:
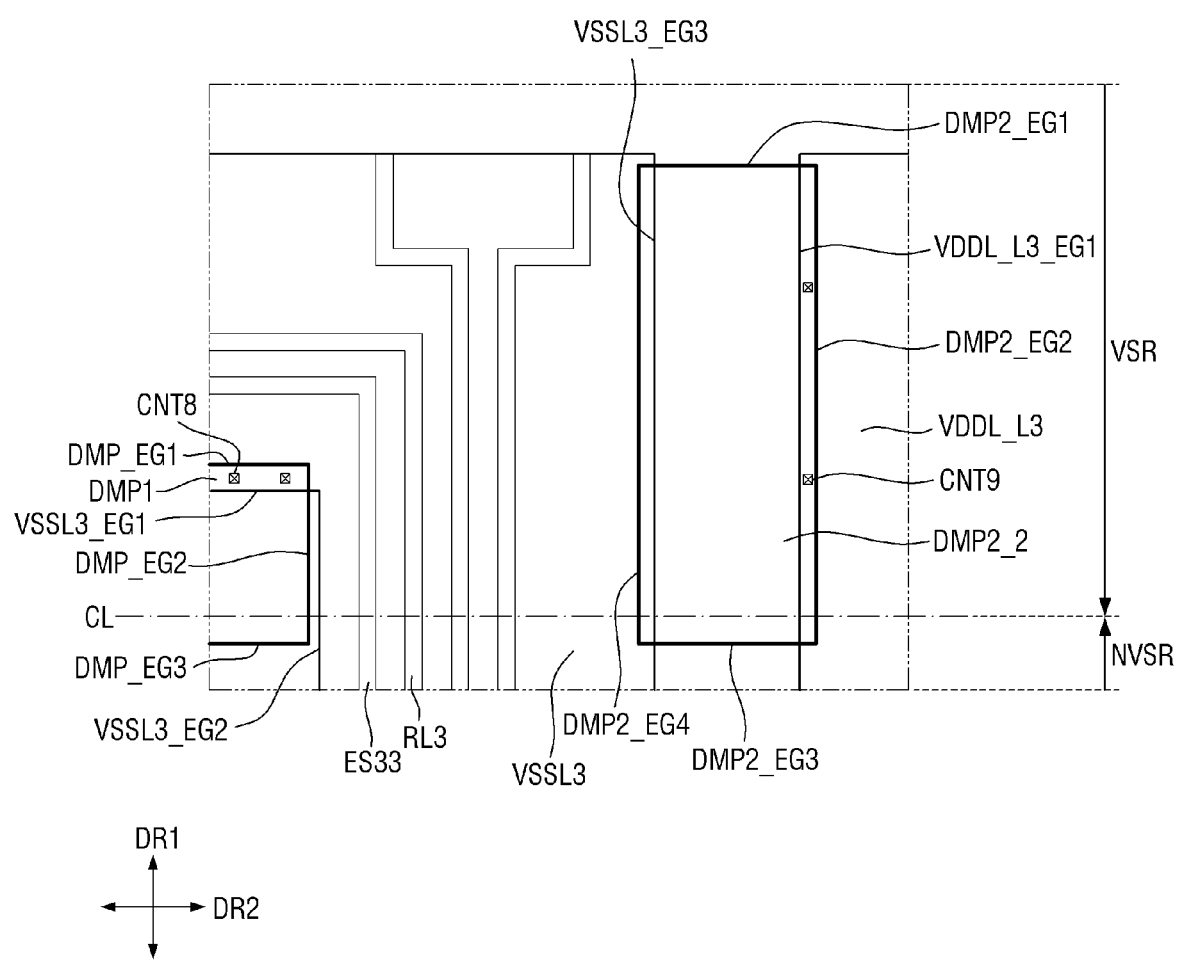
FIG. 24 is an enlarged plan view of the periphery of a first dummy pattern and a second dummy pattern according to yet another embodiment.

FIG. 24 is an enlarged plan view of the periphery of a first dummy pattern and a second dummy pattern according to yet another embodiment.

The embodiment of FIG. 24 is different from the embodiment of FIG. 13 in that dummy patterns DMP1 and DMP2 receive constant voltage from adjacent third supply voltage signal line parts VSSL3 and VDDL_L3, respectively.

As shown in FIG. 24, a first dummy pattern DMP1 may receive a first supply voltage applied to a third supply voltage signal line part VSSL3 through the adjacent third supply voltage signal line part VSSL3 and a contact hole CNT8. A second dummy pattern DMP2 may receive a second supply voltage applied to a third supply voltage signal line part VDDL_L3 through the adjacent third supply voltage signal line part VDDL_L3 and a contact hole CNT9. If each of the dummy patterns DMP1 and DMP2 is floating, a certain voltage may be generated by the dummy patterns DMP1 and DMP2 and the lines of a driving circuit adjacent thereto, and thus signal interference may be generated between the dummy patterns DMP1 and DMP2 and the adjacent touch signal lines. Accordingly, it is possible to prevent signal interference of the adjacent touch signal lines due to floating by electrically connecting the dummy patterns DMP1 and DMP2 with the supply voltage signal line parts VSSL3 and VDDL_L3 located in the adjacent source-drain conductive layer. Further, when the first dummy pattern DMP1 is disposed closer to the third supply voltage line part VSSL3 than the third supply voltage signal line part VDDL_L3, it is possible to prevent parasitic capacitance between the third supply voltage signal line parts VSSL3 and VDDL_L3 by electrically connecting it with the third supply voltage signal line part VSSL3 which is closer.

Figure 25:
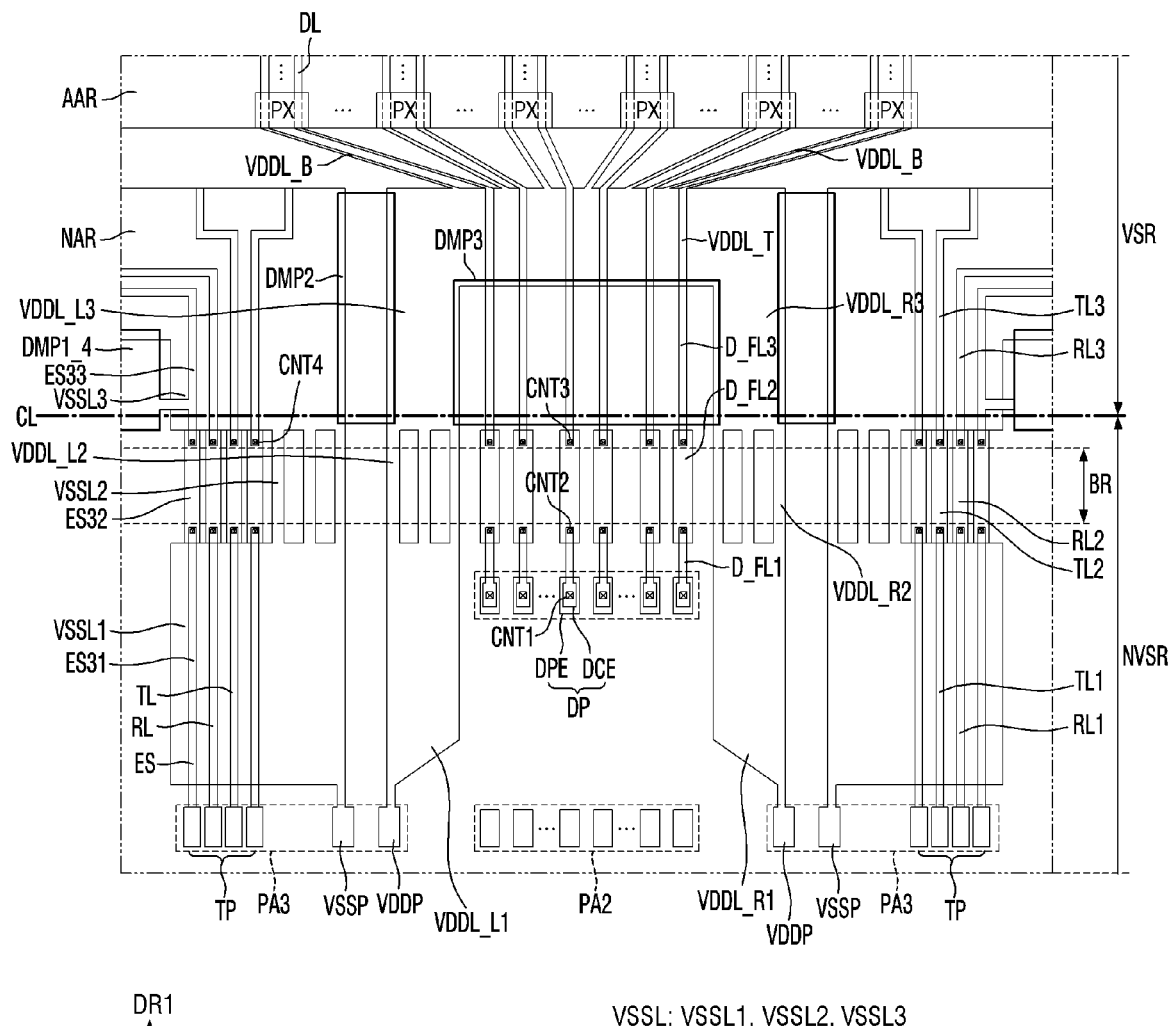
FIG. 25 is an enlarged plan view of a part of an active area and a non-active area according to yet another embodiment.

FIG. 25 is an enlarged plan view of a part of an active area and a non-active area according to yet another embodiment.

According to the embodiment shown in FIG. 25, a first dummy pattern DMP1_4 is connected directly to an adjacent touch signal line (a third touch antistatic line ES3 in the example shown in FIG. 25), so that a signal from the adjacent touch signal line may be applied. Although the first dummy pattern DMP1_4 is connected only to the adjacent touch signal line in the example shown in FIG. 25, the embodiments described herein are not limited thereto. The dummy pattern DMP1_4 may be connected to another line that is not adjacent to it through a bridge or the like.

Figure 26:
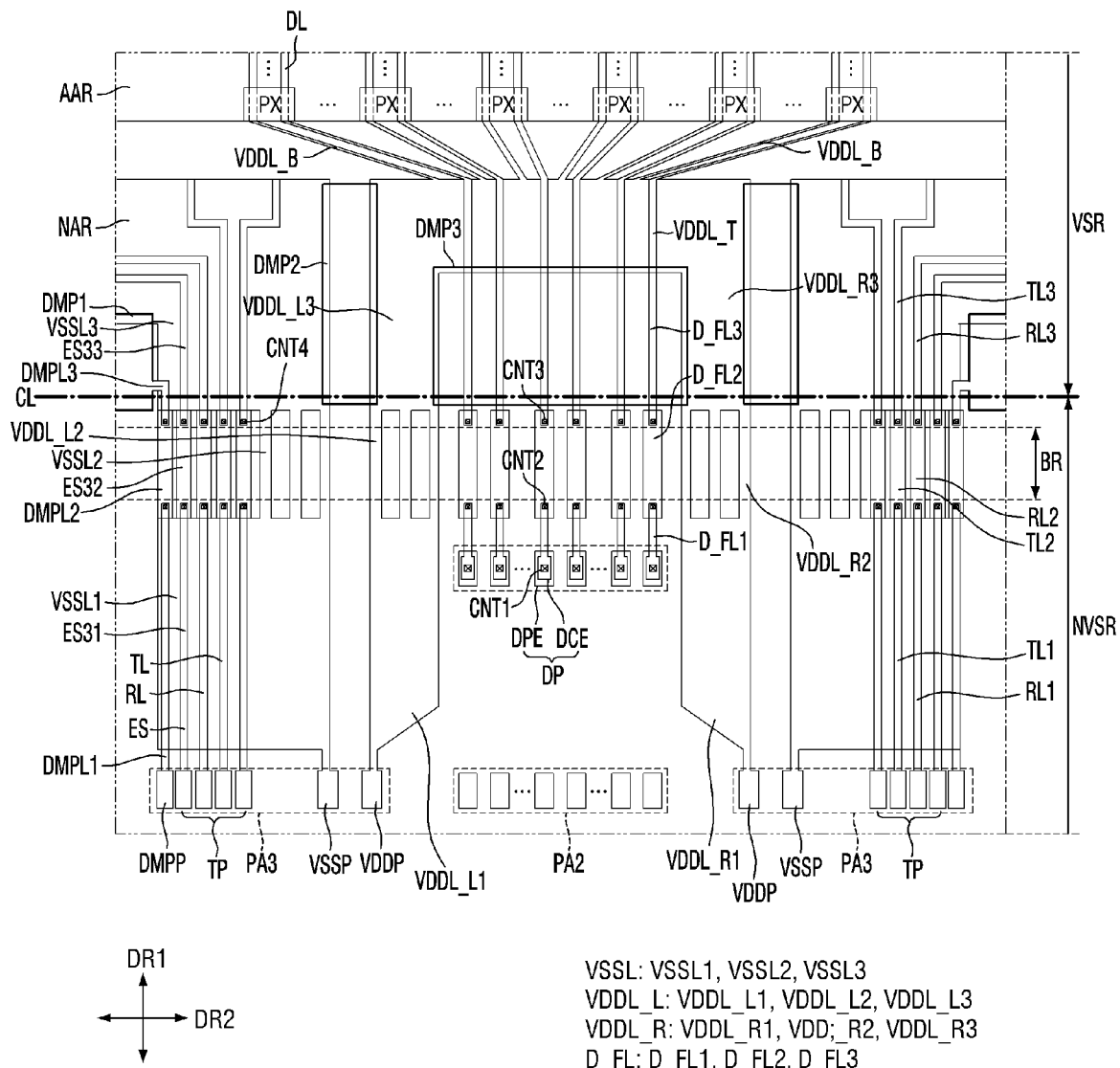
FIG. 26 is an enlarged plan view of a part of an active area and a non-active area according to yet another embodiment.

FIG. 26 is an enlarged plan view of a part of an active area and a non-active area according to yet another embodiment.

A first dummy pattern DMP1_1 according to this embodiment of FIG. 26 is different from the first dummy pattern DMP1 according to the embodiment of FIG. 13 in that a constant voltage can be applied through a dummy pattern pad DMPP.

According to this embodiment, a dummy pattern pad DMPP disposed in a third pad area PA3 may be further included, and the dummy pattern pad DMPP may be connected to the first dummy pattern DMP1 through a dummy pattern line. The dummy pattern line may include a first dummy pattern line part DMPL1 directly connected to the dummy pattern pad DMPP, a second dummy pattern line part DMPL2 connected to the first dummy pattern line part DMPL1, and a third dummy pattern line part DMPL3 that connects the second dummy pattern line part DMPL2 with the first dummy pattern DMP1. Structures such as the planar shape and cross-sectional shape of each of the dummy pattern line parts DMPL1 to DMPL3 of the dummy pattern line are substantially identical to those of the third touch sensing line part RL3; and, therefore, the redundant description will be omitted for sake of brevity.

Hereinafter, a method of including a black-based colorant in at least one of the organic layers of the display panel in order to reduce a difference in black color between the first to third line-free areas and adjacent areas where lines are disposed will be described. Since such a difference in black color between the areas may be recognized in the visible region VSR, it is desired that a black-based colorant is applied to the organic layers located in the visible region VSR.

Figure 27:
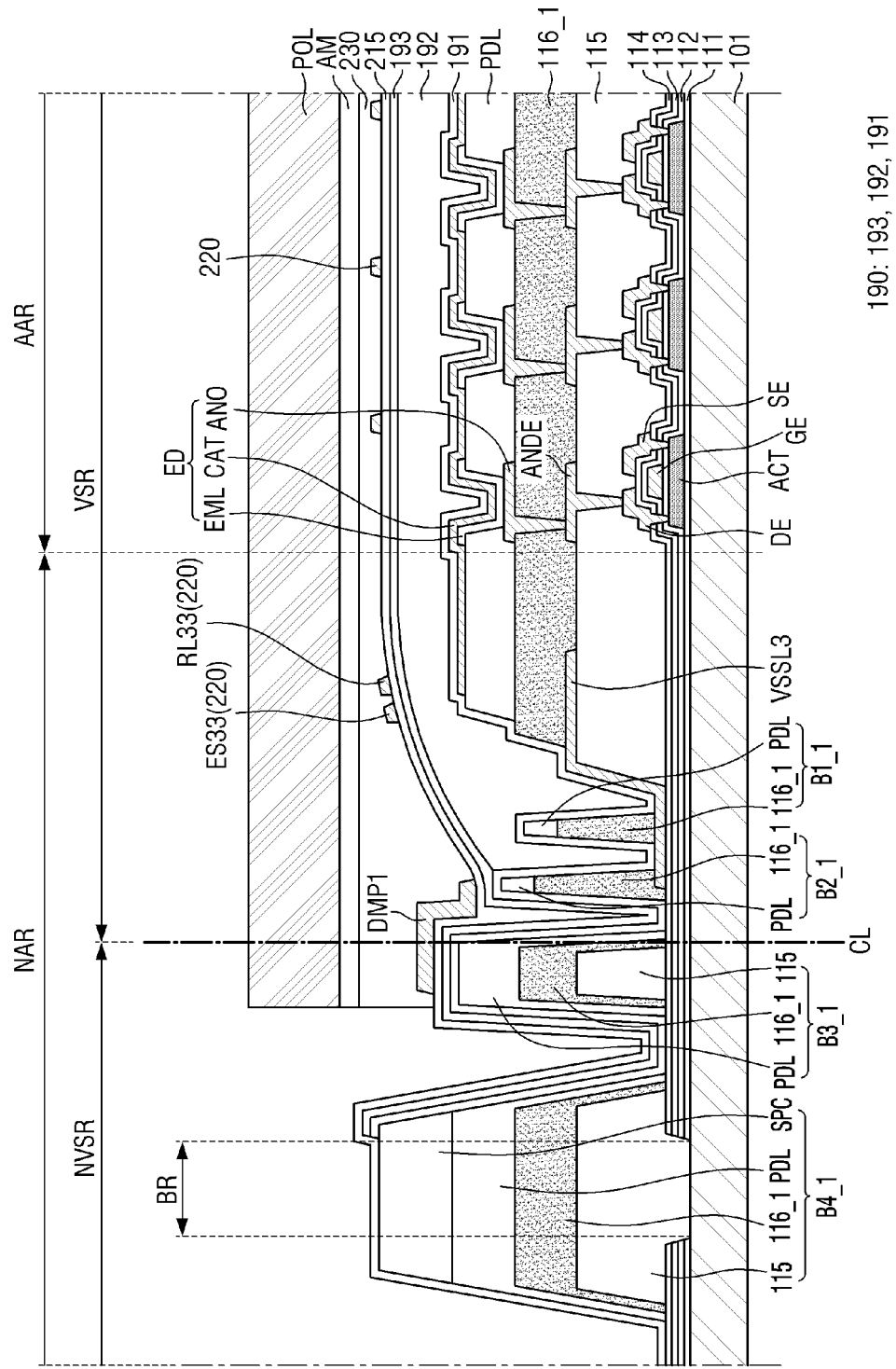
FIG. 27 is a cross-sectional view of a part of an active area and a part of a non-active area according to yet another embodiment.

FIG. 27 is a cross-sectional view of a part of an active area and a part of a non-active area according to another embodiment. In the example shown in FIG. 27, a black-based colorant is applied to a second via layer 116_1. Referring to FIG. 27, the second via layer 116_1 according to this embodiment may include a black-based colorant. The black-based colorant may include a black-based pigment or a black-based dye. As the black-based colorant is applied to the second via layer 116_1, the second via layer 116_1 of each of the block patterns B1_1, B2_1, B3_1 and B4_1 may include a black-based colorant.

Figure 28:
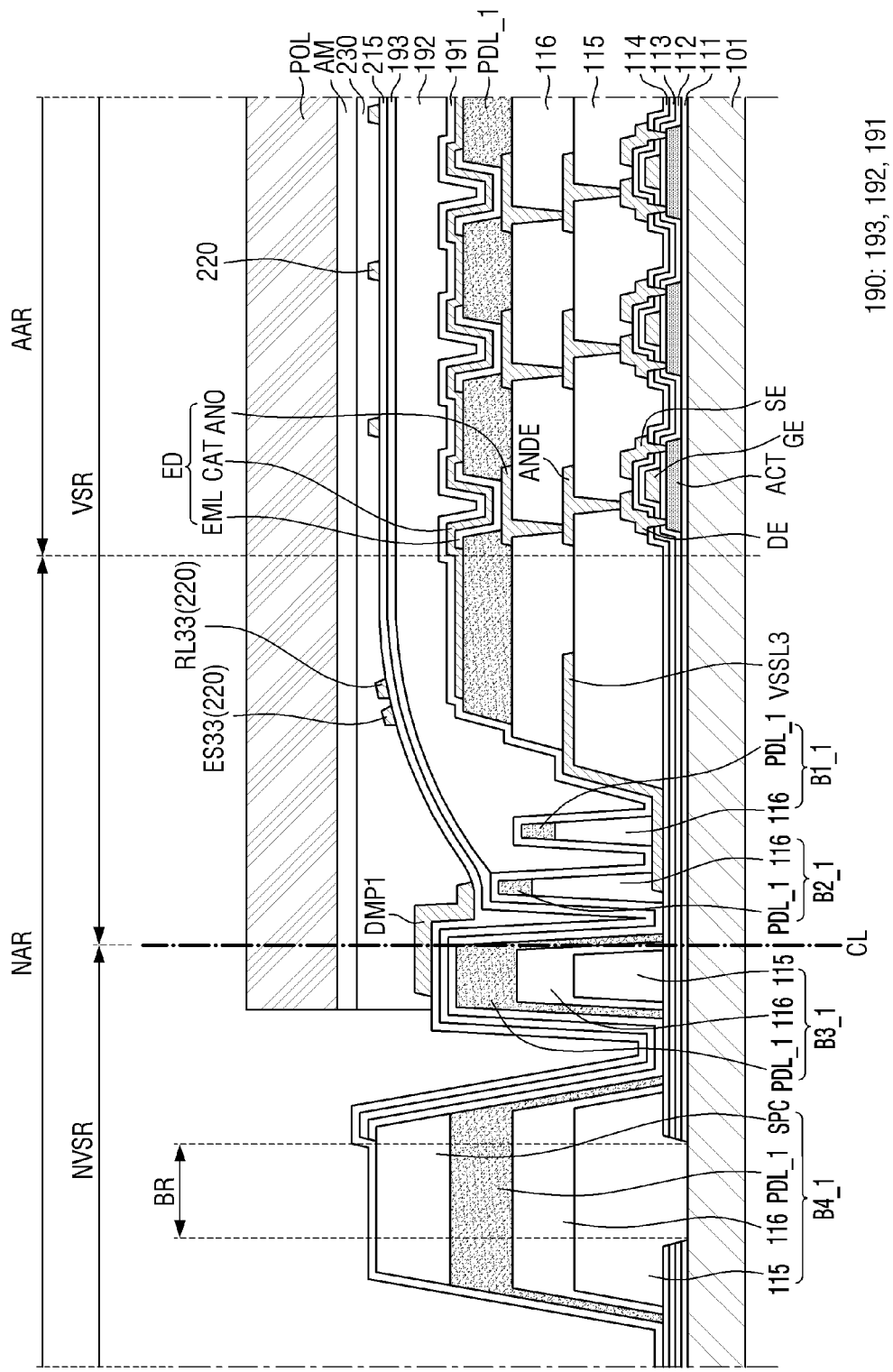
FIG. 28 is a cross-sectional view of a part of an active area and a part of a non-active area according to one or more embodiments.

FIG. 28 is a cross-sectional view of a part of an active area and a part of a non-active area according to yet another embodiment. In the example shown in FIG. 28, a black-based colorant is applied to a bank layer PDL_1. Referring to FIG. 28, the bank layer PDL_1 according to this embodiment may include a black-based colorant. The black-based colorant may include a black-based pigment or a black-based dye. As a black-based colorant is applied to the bank layer PDL_1, the black-based colorant may also be applied to each of the block patterns B1_1, B2_1, B3_1, and B4_1.

Although a black-based colorant is applied to the bank layer or the second via layer in the examples shown in FIGS. 27 and 28, the embodiments described herein are not limited thereto. The black-based colorant may be applied to the bank layer and also to the second via layer.

Although embodiments of the invention have been disclosed for illustrative purposes, those skilled in the art will appreciate that various modifications, additions and substitutions are possible, without departing from the scope of the invention as disclosed in the accompanying claims.

What is claimed is:

1. A display device comprising:
   a substrate having a visible region with an active area and a non-active area located on one side of the active area in a first direction, and a non-visible region defined thereon, wherein the non-visible region is disposed farther from the active area in the first direction than the non-active area is;
   a first conductive layer disposed on the substrate;
   a first insulating layer disposed on the first conductive layer;
   a second conductive layer disposed on the first insulating layer;
   a first via layer disposed on the second conductive layer;
   a second insulating layer disposed on the first via layer; and
   a third conductive layer disposed on the second insulating layer and comprising a plurality of touch signal lines,
   wherein the non-active area of the visible region comprises a line area where the second conductive layer is disposed, and a line-free area where the second conductive layer is not disposed, and
   wherein the third conductive layer comprises a first dummy pattern that is disposed in the line-free area and has a width greater than a width of the touch signal lines.

2. The display device of claim 1, wherein the non-active area comprises a bending region spaced apart from the active area, and wherein a boundary between the visible region and the non-visible region is located between the bending region and the active area.

3. The display device of claim 2, wherein the second conductive layer comprises a first signal line that is extended from the non-visible region to the visible region and bent in a second direction crossing the first direction.

4. The display device of claim 3, wherein the line-free area comprises a first line-free area defined by an edge of the first signal line, the non-visible region and a boundary line of the visible region when viewed from above the display device, and wherein the first dummy pattern is disposed in the first line-free area.

5. The display device of claim 4, wherein the first signal line comprises a low-level supply voltage signal line.

6. The display device of claim 5, wherein the first dummy pattern overlaps a boundary between the non-visible region and the visible region in a thickness direction.

7. The display device of claim 6, wherein the first dummy pattern overlaps with an end of the first signal line in the thickness direction.

8. The display device of claim 7, wherein the first dummy pattern is electrically connected to the first signal line.

9. The display device of claim 7, wherein the plurality of touch signal lines overlaps with the first signal line, and
   wherein a separation distance between the first dummy pattern and an adjacent one of the touch signal lines is equal to or greater than a separation distance between the touch signal lines adjacent to each other.

10. The display device of claim 7, wherein the touch signal lines are extended such that they overlap the first signal line, and wherein the first dummy pattern is electrically connected to the touch signal lines.

11. The display device of claim 7, wherein the plurality of touch signal lines and the first signal line are extended from a pad area on an end of the substrate,
    wherein the pad area comprises touch pads connected to the plurality of touch signal lines, a first signal line pad connected to the first signal line, and a dummy pattern pad connected to the first dummy pattern, and
    wherein the first dummy pattern is connected to the first dummy pattern pad through a dummy pattern line connected to the dummy pattern pad.

12. The display device of claim 5, further comprising:
    a bank layer disposed on the first via layer,
    wherein at least one of the first via layer and the bank layer further comprises a black-based colorant.

13. The display device of claim 5, wherein the second conductive layer further comprises a second signal line spaced apart from the first signal line, and
    wherein the line-free area further comprises a second line-free area defined by an edge of the first signal line, an edge of the second signal line and the boundary line.

14. The display device of claim 13, wherein the third conductive layer further comprises a second dummy pattern disposed in the second line-free area, and wherein the second dummy pattern overlaps the boundary line.

15. The display device of claim 14, wherein the second dummy pattern is electrically connected to the second signal line.

16. The display device of claim 14, wherein the second signal line comprises a high-level supply voltage signal line,
wherein the high-level supply voltage signal line comprises a first-side high-level supply voltage signal line and a second-side high-level supply voltage signal line that are extended in a first direction and spaced apart from each other in a second direction, and comprises a connection high-level supply voltage signal line that connects the first-side high-level supply voltage signal line with the second-side high-level supply voltage signal line, and
wherein the line-free area further comprises a third line-free area defined by an edge of the first-side high-level supply voltage signal line, an edge of the second-side high-level supply voltage signal line, an edge of the connection high-level supply voltage signal line, and the boundary line.

17. The display device of claim 16, wherein the third conductive layer further comprises a third dummy pattern disposed in the third line-free area, and wherein the third dummy pattern overlaps the boundary line.

18. A display device comprising:
a substrate having an active area and a non-active area on one side of the active area in a first direction defined thereon;
a first conductive layer disposed on the substrate;
a first insulating layer disposed on the first conductive layer;
a second conductive layer disposed on the first insulating layer;
a first via layer disposed on the second conductive layer;
a second insulating layer disposed on the first via layer;
a third conductive layer disposed on the second insulating layer and comprising a plurality of touch signal lines; and
a protective layer disposed on the third conductive layer and having a black matrix disposed on a surface thereof that faces the substrate,
wherein an end of the black matrix is spaced apart from the active area when viewed from above the display device,
wherein the non-active area comprises a non-visible region in which the black matrix is disposed entirely, and a visible region in which the black matrix is disposed partially,
wherein the visible region comprises an area where the second conductive layer is disposed, and a line-free area where the second conductive layer is not disposed, and
wherein the third conductive layer comprises a dummy pattern that is disposed in the line-free area and has a width larger than a width of the touch signal lines.

19. The display device of claim 18, further comprising:
a polarization layer disposed between the black matrix and the third conductive layer,
wherein the polarization layer is disposed to overlap a boundary between the non-visible region and the visible region in a thickness direction.

20. The display device of claim 18, wherein the dummy pattern overlaps a boundary between the non-visible region and the visible region in a thickness direction.

21. A display device comprising:
a substrate having an active area, a visible region located on the active area, and a non-visible region defined thereon;
a plurality of conductive layers disposed on the substrate on top of each other in a layered manner; and
at least one insulating layer disposed between the plurality of conductive layers to thereby separate the plurality of conductive layers from being in electrical contact with each other,
wherein the visible region comprises a line area where one of the conductive layers beneath the topmost conductive layer is disposed, and a line-free area where the one of the conductive layers beneath the topmost conductive layer is not disposed,
wherein the topmost conductive layer comprises a first dummy pattern that is disposed in the line-free area,
wherein a first portion of the first dummy pattern is disposed in visible region and a second portion of the first dummy pattern smaller than the first portion is disposed in the non-visible region, and
wherein the first dummy pattern overlaps a part of a supply voltage signal line part in a thickness direction of the substrate.

22. The display device of claim 21, wherein the topmost conductive layer includes a plurality of touch signal lines provided therein, and
wherein the first dummy pattern has a width greater than a width of the touch signal lines.

* * * * *